(12) United States Patent
Linares et al.

(10) Patent No.: US 6,858,080 B2
(45) Date of Patent: Feb. 22, 2005

(54) TUNABLE CVD DIAMOND STRUCTURES

(75) Inventors: Robert C. Linares, Sherborn, MA (US); Patrick J. Doering, Holliston, MA (US)

(73) Assignee: Apollo Diamond, Inc., Medfield, MA (US)

(*) Notice: Subject to any disclaimer, the term of this patent is extended or adjusted under 35 U.S.C. 154(b) by 0 days.

(21) Appl. No.: 10/328,987

(22) Filed: Dec. 24, 2002

(65) Prior Publication Data

US 2003/0131787 A1 Jul. 17, 2003

Related U.S. Application Data

(63) Continuation-in-part of application No. 09/312,326, filed on May 14, 1999, now Pat. No. 6,582,513
(60) Provisional application No. 60/085,542, filed on May 15, 1998.

(51) Int. Cl.[7] ............................................. C30B 29/04
(52) U.S. Cl. ..................... 117/86; 117/87; 117/104; 117/929; 423/446
(58) Field of Search ........................ 117/104, 929, 117/86, 87; 423/446

(56) References Cited

U.S. PATENT DOCUMENTS

| | | | |
|---|---|---|---|
| 3,850,591 A | 11/1974 | Wentorf, Jr. | 51/307 |
| 4,034,066 A | 7/1977 | Strong et al. | 117/79 |

(List continued on next page.)

FOREIGN PATENT DOCUMENTS

| | | |
|---|---|---|
| EP | 0 507 497 | 3/1992 |
| EP | 0 573 943 | 6/1993 |
| EP | 0 582 397 | 7/1993 |
| EP | 0 588 260 | 9/1993 |
| EP | 0 635 584 | 7/1994 |
| EP | 0 879 904 | 4/1998 |
| EP | 0 918 100 | 10/1998 |
| GB | 2 228 949 | 2/1990 |
| JP | 10-081590 | * 3/1998 |
| WO | WO 01/96633 | 12/2001 |
| WO | WO 01/96634 | 12/2001 |

OTHER PUBLICATIONS

Anthony et al., "Thermal diffusivity of isotropically enriched 12c diamond", *Physical Review B* pp. 1104–1111.

R.C. Burns and G Davis, "Growth of Synthetic Diamond", pp. 396–422, *The Properties of Natural and Synthetic Diamond*, J.F. Field, editor, Academic Press (1992).

(List continued on next page.)

*Primary Examiner*—Robert Kunemund
(74) *Attorney, Agent, or Firm*—Fredrikson & Byron, P.A.

(57) ABSTRACT

Monocrystalline diamond, adapted for use as in applications such as semiconductor devices, optical waveguides, and industrial applications, in the form of a single crystalline diamond structure having one or more diamond layers, at least one of which is formed by a CVD process. The diamond layers are "lattice-matched" or "lattice-mismatched" to each other to provide a desired level of strain.

45 Claims, 2 Drawing Sheets

U.S. PATENT DOCUMENTS

| | | | | |
|---|---|---|---|---|
| 4,767,608 | A | 8/1988 | Matsumoto et al. | 423/446 |
| 4,905,227 | A | 2/1990 | Lechner et al. | 370/365 |
| 4,940,015 | A | 7/1990 | Kobashi et al. | 118/723 |
| 5,110,579 | A | 5/1992 | Anthony et al. | 423/446 |
| 5,127,983 | A | 7/1992 | Imai et al. | 156/610 |
| 5,135,730 | A | 8/1992 | Suzuki et al. | 423/446 |
| 5,273,731 | A | 12/1993 | Anthony et al. | 423/446 |
| 5,290,392 | A | 3/1994 | Lau et al. | 156/610 |
| 5,314,652 | A | 5/1994 | Simpson et al. | 264/81 |
| 5,360,479 | A | 11/1994 | Banholzer et al. | 117/84 |
| 5,387,310 | A | 2/1995 | Shiomi et al. | 117/101 |
| 5,419,276 | A | 5/1995 | Anthony et al. | 117/86 |
| 5,443,032 | A | 8/1995 | Vichr et al. | 117/84 |
| 5,496,596 | A * | 3/1996 | Herb et al. | 427/577 |
| 5,540,904 | A | 7/1996 | Bovenkerk et al. | 423/446 |
| 5,587,013 | A | 12/1996 | Ikegaya et al. | 117/89 |
| 5,587,210 | A | 12/1996 | Marchywka et al. | 427/523 |
| 5,614,019 | A | 3/1997 | Vichr et al. | 117/84 |
| 5,628,824 | A | 5/1997 | Vohra et al. | 117/101 |
| 5,635,258 | A | 6/1997 | Chen et al. | 427/577 |
| 5,653,952 | A | 8/1997 | Suzuki et al. | 423/446 |
| 5,656,827 | A | 8/1997 | Kang et al. | 257/76 |
| 5,803,967 | A | 9/1998 | Plano et al. | 117/929 |
| 6,582,513 | B1 * | 6/2003 | Linares et al. | 117/93 |

OTHER PUBLICATIONS

*CVD Diamond: a New Engineering Material for Thermal, Dielectric and Optical Applications*, R.S. Sussman, et al., Industrial Diamond Review, 58(578):69–77 (1998).

W. Ebert, et al, "Epitaxial Diamond Schottky Barrier Diode With On/Off Current Ratios in excess of $10^7$ at High Temperatures", Proceedings of IEDM, pp. 419–422 (1994), Published by IEEE.

R. Eden, *Applications in Computers*, Handbook of Industrial Diamonds and Diamond Films, pp 1073–1102, Editors, Mark Prelas, Galina Popovici and Louis Bigelow, Marcel Decker, Ny, 1998).

J.E. Field et al., *The Properties of Natural and Synthetic Diamond Academic Press* (1992).

P. Hui, et al, Temperature Distribution in a Heat Dissipation System Using a Cylindrical Diamond Heat Spreader on a Copper Block, J. Appl. Phys. 75(2), Jan. 15, 1994).

Hunn JD et al, "Ion hearn and laser–assisted micromachining of single–crystal diamond", Solid State Technology, Cowan Publ. Corp. Washington, US. vol. 37 no. 12, Dec. 1, 1994, pp. 57–60.

McCauley TS et al, "Homoepitaxial Diamond Film Deposition on a Brilliant Cut Diamond Anvil", Applied Physics Letters, American Institute of Physics, New York, US, vol. 66, no. 12, Mar. 20, 1995, pp. 1486–1488.

V.I Nepsha, "Heat Capacity, Conductivity, and Thermal Coefficient of Expansion", pp. 147–192, *Handbook of Industrial Diamond and Diamond Films*, M.A. Prelas, G. Popovici, and L.K. Bigelow, Editors, Marcel Dekker, Inc. (1998).

Perng et al., "Modification in the bond structure and related commission characteristics of defective diamond film doped with boron", Applied Surface Science 142 (1999), 494–498.

Plano MA et al, "Characterization of a thick homoepitaxial CVD diamond film" Diamond, SIC and Nitride Wide Bandgap Semiconductors, Symposium, Diamond, SIC and Nitride Wide Bandgap Semiconductors, Symposium, San Francisco, CA, USA, Apr.–Aug. 1994, pp. 307–312, Pittsburg, PA, USA, Mater. Res. Soc, USA.

S. Sahli, et al., "Piezoelectric Gauge Factor Measured at Different Fields and Temperatures", pp. 95–98, *Applications of Diamond Films and Related Materials*, A. Feldman, et al. editors, NIST Special Publications 885.

Samlenski, R. et al., Incorporation of Nitrogen in Chemical Vapor Deposition Diamond, Applied Physics Letters, American Institute of Physics, New York, US, vol. 67, no. 19, Nov. 6, 1995, pp. 2798–2800.

Y. Sato and M. Kamo, "Synthesis of Diamond From the Vapor Phase", pp. 423–469, *The Properties of Natural and Synthetic Diamond*, J.E. Field, editor, Academic Press (1992).

M. Seal, "High Technology Applications of Diamond", pp. 608–616, *The Properties of Natural and Synthetic Diamond* Edited by J.E. Field, Academic Press (1992).

\* cited by examiner

TUNABLE CVD DIAMOND STRUCTURES

CROSS REFERENCE TO RELATED APPLICATIONS

The present application is a continuation-in-part of U.S. patent application filed May 14, 1999 and assigned Ser. No. 09/312,326, now U.S. Pat. No. 6,582,513 and in turn, of U.S. provisional application filed May 15, 1998 and assigned Ser. No. 60/085,542, the entire disclosures of both which are incorporated herein by reference.

TECHNICAL FIELD

The present invention relates to synthetic monocrystalline diamonds, specifically relating to diamonds prepared using chemical vapor deposition (CVD). In particular, the invention relates to diamonds that are engineered to function in a variety of applications, some of which include semiconductor devices, optical waveguides, and industrial applications.

BACKGROUND OF THE INVENTION

Diamond provides a wide and useful range of properties, including extreme mechanical hardness, low coefficient of thermal expansion, high chemical inertness and wear resistance, low friction, and high thermal conductivity. Generally, diamond is also electrically insulating and optically transparent from the ultra-violet (UV) to the far infrared (IR), with the only absorption occurring from carbon-carbon bands that range from about 2.5 $\mu$m to 6 $\mu$m. Given their properties, diamond can be utilized in many diverse applications in industry, however its overall utilization has long been hampered by the comparative scarcity of natural diamond. In turn, there has been a long-running quest for processes to synthesize diamond in the laboratory.

Synthetic diamonds are currently produced by a variety of methods. One such method involves a process referred to as chemical vapor deposition (CVD). CVD diamond has only been commercially synthesized for the last 15 years. This diamond growing method involves providing a hydrocarbon gas (typically methane) in an excess of atomic hydrogen. Generally, a gas-phase chemical reaction occurs above a solid surface, which causes deposition onto that surface. All CVD techniques for producing diamond films require a means of activating the gas-phase carbon-containing precursor molecules. This generally involves thermal (e.g., hot filament) or plasma (e.g., D.C., R.F., or microwave) activation, or the use of a combustion flame (oxyacetylene or plasma torches). Two of the more popular experimental methods include the use of a hot filament reactor, and the use of a microwave plasma enhanced reactor. While each method differs in regards to activation, they all share similar aspects otherwise. For example, growth of CVD diamond (rather than deposition of other, less well-defined, forms of carbon) normally requires that the substrate be maintained at a temperature in the range of 1000–1400 K, and that the precursor gas be diluted in an excess of hydrogen (typical $CH_4$ mixing ratio ~1%–12% in volume).

CVD diamond grows in a two-dimensional manner, layer by layer, and it is therefore possible to build up a bulk diamond crystal (or plate or film) which can be of a single composition or composed of layers of many compositions (called a "structure"). CVD diamond grown in this manner can show mechanical, tribological, and even electronic properties comparable to or exceeding those of natural diamond. See, for example, Y. Sato et al., "Synthesis of Diamond From the Vapor Phase", *The Properties of Natural and Synthetic Diamond*, J. E. Field Academic Press, pp. 423–469 (1992). See also U.S. Pat. Nos. 4,940,015; 5,135,730; 5,387,310; 5,314,652; 4,905,227; and 4,767,608. Because of its ability for growth in terms of size and shape, CVD diamond can be used in a variety of applications. For a general analysis of differing applications, see M. A. Prelas et al., *Handbook of Industrial Diamond and Diamond Films*, Editors, Marcel Dekker, Inc., pp. 1023–1147 (1998).

Natural diamond is generally considered a good electrical insulator, however, if doped with appropriate impurities, it can be made into a good semiconductor as well. Because of this, there has been expanded research in terms of using monocrystalline diamond, both natural and synthetic, in a wide variety of electrical applications. Monocrystalline CVD diamond can be grown with sufficient control to achieve high performance electrical characteristics that are substantially greater than those found in natural high quality diamonds, as well as those found in other semi-conducting elements. These improved electrical characteristics include increased resistivity, increased breakdown voltage, increased carrier lifetime, increased electron and hole mobility, and increased charge collection distance. See PCT application WO 01/96633, the disclosure of which is incorporated herein by reference. In addition, it has been shown that the same improved electrical characteristics can be achieved with monocrystalline CVD diamond grown to a thickness of at least 2 mm. With this increased thickness, the grown CVD diamond can be utilized in additional applications that involve high pressures or temperatures (anvils) or involve cutting away layers (gemstone production). See PCT application WO 01/96634, the disclosure of which is incorporated herein by reference.

The properties of synthetic monocrystalline diamonds depend largely on the defects or impurities in the crystal. By controlling these factors, one can control not only the electrical properties, but also other properties of the diamond, including its optical and mechanical properties to name just a few (see M. A. Prelas et al., *Handbook of Industrial Diamond and Diamond Films*, Marcel Dekker, Inc., p. 20 (1998)). This realization has led to much research in terms of controlling the impurities during CVD growth. For example, it has been shown that the addition of boron to a synthetic monocrystalline or polycrystalline diamond makes it useful for constructing a semiconductor device, a strain gauge or other electrical device although monocrystalline diamond is to be preferred. See U.S. Pat. No. 5,635,258. See also, W. Ebert, et al., "Epitaxial Diamond Schottky Barrier Diode With On/Off Current Ratios in excess of $10^7$ at High Temperatures", *Proceedings of IEDM*, published by IEEE, pp. 419–422 (1994) and S. Sahli et al., "Piezoelectric Gauge Factor Measured at Different Fields and Temperatures", *Applications of Diamond Films and Related Materials*, NIST Special Publications (885) pp. 95–98.

Thus, by doping CVD diamond, which is comprised of carbon isotopes, one can create the same devices, e.g., semiconductors, that have historically been created utilizing other materials than diamond that were more readily available. However, in using diamond instead of the other materials, all the vast properties of diamond can now be taken advantage of in the produced device.

With recent developments in the growth and fabrication of single crystal CVD diamond, there has been much excitement in the industry in regards to their overall utilization. However, efforts thus far have not produced the kind of quality diamonds that were originally intended or desired. While there remains a need for CVD diamond in the industry, there still needs to be a solution to the above-described shortcomings of the efforts to date.

SUMMARY OF THE INVENTION

The present invention provides a method and structure for providing synthetic monocrystalline diamond, adapted for use as in applications such as semiconductor devices, optical waveguides, and industrial applications. The synthetic monocrystalline diamond mentioned above refers to a single crystalline diamond structure having one or more diamond layers, at least one of which is formed by a CVD process. In preferred embodiments of the invention, the diamond layers will be "lattice-matched" to each other, meaning the layers will coexist without undue strain for a desired purpose. In other embodiments of the invention, the layers will be deliberately strained in relationship to each other to achieve another desired purpose. Either embodiment can be used, for instance, to direct electrons in the case of a semiconductor device or to direct photons in the case of an optical waveguide. Applicants have discovered the manner in which layered lattices can be "tuned" together, that is matched to eliminate strain and/or not matched, in order to introduce strain, and in turn, can be used to provide diamond structures with improved properties over those described in the art to date.

In one embodiment, a method of the invention involves forming a synthetic monocrystalline diamond. One step of the method involves forming a first synthetic diamond layer incorporating one or more impurities and one or more carbon isotopes on a substrate by a chemical vapor deposition process. Another step involves selecting the concentrations of the one or more carbon isotopes and the one or more impurities during the formation of the first synthetic diamond layer in order to form the diamond layer with a predetermined lattice constant having a corresponding level of lattice strain.

In another embodiment, a method of the invention involves fabricating one of either electrical, optical, or industrial devices. One step of each of the methods involves designing the device having specific parameters that are warranted for a predetermined operation. Another step involves forming a monocrystalline synthetic diamond by using the method described above and based on the specific parameters that are warranted for the predetermined operation. Finally, a step involves creating the electrical device with the monocrystalline synthetic diamond.

A structure of the invention comprises a first synthetic diamond layer that, in turn, comprises one or more impurities and one or more carbon isotopes. The one or more carbon isotopes and the one or more impurities are in concentrations such that the first synthetic diamond layer formed by a chemical vapor deposition process has a predetermined lattice constant.

DETAILED DESCRIPTION

Figure 1:
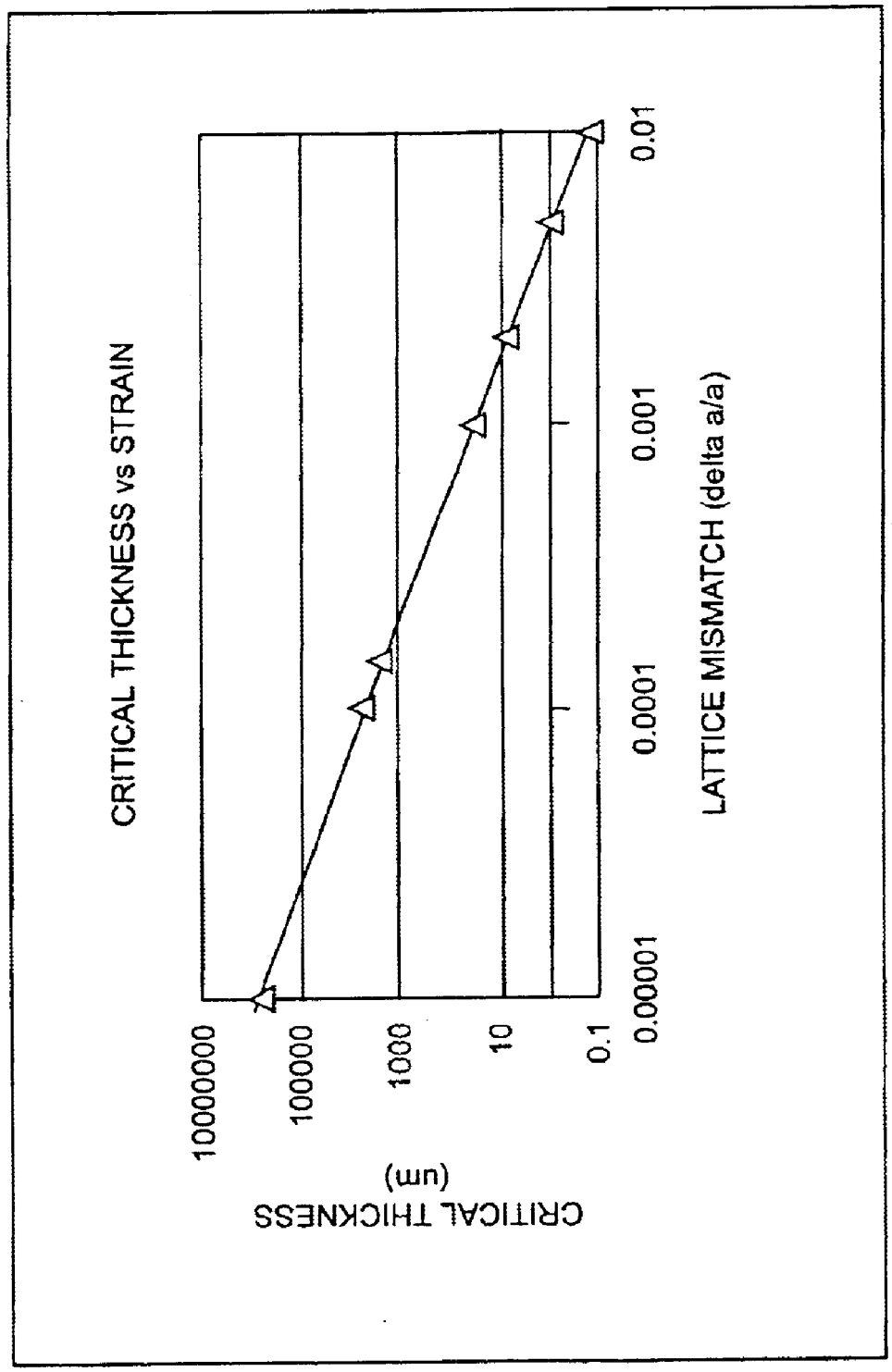
FIG. 1 is a graph showing critical thickness versus lattice mismatch strain for one embodiment of the invention.

Applications for synthetic CVD diamonds seem limitless. While not trying to provide an exhaustive list, some of these applications are electrical in nature and comprise semiconductor devices, field effect transistors, light emitting diodes, high voltage switches, p-n junctions, Schottky diodes, surgical device contact surfaces, sensors, detectors, electrodes, filters, and quantum computing devices. Some other applications are optical in nature and comprise waveguides, windows, gemstones, anvils, light emitting diodes, and filters. Still, other applications are industrial in nature and comprise cutting tools, wear plates, bearings, wire dies, abrasives, heat spreaders, wire dies, microtomes, and spacers.

Semiconductors have electrical properties that generally fall between pure metals and pure insulators. By adding impurities to the lattice structures of a semiconductor, one can in essence vary its electrical conducting properties. See, generally, S. M. Sze, "The Ideal Semiconductor: A Wish List", *High Speed Semiconductor Devices*, editor, Wiley-Interscience, pp. 14–21 (1990). Since they offer such versatility in how they can be made to conduct, semiconductors work well in the design of electrical devices. Some of the electrical devices using semiconductors include two terminal devices (e.g., diodes, light-emitting diodes (LEDs), and detectors), three terminal devices (e.g., field effect transistors (FETs) and switches) and multi-terminal devices (e.g., integrated circuit (IC) chips).

In creating electrical devices using semiconductors, one can often use a single element semi-conducting material such as Si (Silicon) or Ge (Germanium). However, in many cases, one would want to use a combination of two or more elements, to produce a compound semiconductor, e.g., GaAs (Gallium Arsenide), SiC (Silicon Carbide), ZnSe (Zinc Selenide), or an alloy of two semiconductors, e.g. Si/Ge (Silicon-Germanium) or GaAs/AlAs (Gallium Arsenide-Aluminum Arsenide), to provide the electrical properties that are desired in a particular device specification. For example, in creating a device that is efficient in emitting or absorbing light, one would normally use semiconductors containing elements from the third and fifth columns of the Periodic Table (e.g., GaAs). Additionally, one could use elements from the second and sixth columns of the Periodic Table (e.g. ZnSe) or two elements from the fourth column of the Periodic Table (e.g. SiC) to provide for light emitting properties. Another example may involve creating a laser device, in which one would want to again use semiconductors containing elements from the third and fifth columns of the Period Table (e.g., AlGaAs).

As previously mentioned, the electrical properties of a device can be varied by introducing impurities into the semiconductor as it is produced. This process is typically referred to as doping, and by doing so, the impurities are added to the semiconductor atomic lattice structure, which leads to atomic expansion (dilation) in the structure. While this expansion is typical, it is also very important to control because if a semiconductor is doped excessively, one can cause significant strain to the lattice. This strain can lead to significant dislocation defects that introduce unwanted changes in the electrical and optical properties of the crystal structure, and if severe enough, damage to the crystal structure and to the device.

In addition, when producing two or more semiconductor layers together, one often cannot get exact lattice matching between the layers. Like excessive doping, the mismatch of the crystalline lattice structure at these layer interfaces can create a strain in the crystal structure. In turn, this strain can also lead to significant dislocation defects that introduce changes in the electrical and optical properties of the strained crystal structure. If severe enough, the dislocations can also, in turn, lead to damage to the crystal structure and damage to the device. Thus, it is very important to limit lattice mismatch in designing electrical devices that utilize two or more semiconductor layers as well.

Optical waveguides, in turn, are devices often utilized within electronic devices to route optical signals. In particular, the waveguides generally direct laser beams around and within a variety of electrical devices, e.g., electrical switches and modulators. A primary advantage of waveguides is their high efficiency, i.e., low transmission loss. Because of their high efficiency in the transmission of optical signals, waveguides are highly regarded in the design of electrical devices.

In creating optical waveguides, it is necessary to place a material having a high index of refraction between two layers of material having lower indexes of refraction. This same procedure is employed in making optical fiber for laser communications, in which a primary glass, having a high index of refraction, is encapsulated in a cladding of secondary glass, having a low index of refraction. Laser light is then internally reflected in the high index core and is guided down the entire length of the core with little loss. In regards to creating waveguides, a semiconductor layer such as GaAlAs, having a high index of refraction, can be grown between two GaAs layers, having lower indices of refraction. Similarly, layers of material having high indices of refraction can also be created by diffusing impurities on and into the surfaces of diamond crystals or glass. Paths can be imparted for the light to follow using etching or electrodes. In so doing, the index of refraction can be changed to enable manipulation and routing of the optical beam.

In regards to producing waveguides, it can be quite advantageous to use a process to introduce impurities into a structure, as mentioned above. By simply adding impurities, one can change the internal pressure, i.e., lattice structure, of the structure, and in turn, directly vary the index of refraction of the structure. However, this process of adding impurities, i.e., doping, to create waveguides has drawbacks similar to what is encountered when forming semiconductors. As impurities are added to form a waveguide, there is an atomic expansion (dilation) in the structure. Once again, while this expansion is typical, it is also vital to control because if the waveguide is doped excessively, one can cause significant strain to the lattice. This strain can lead to significant dislocation defects that introduce unwanted changes in the optical properties of the crystal structure, and if severe enough, damage to the crystal structure and to the device.

As described herein, efforts thus far have been unable to generate quality CVD diamonds that can be utilized in many of the applications described above. For example, by doping CVD diamond in the same manner that is utilized when working with other semiconducting elements, it had been hoped that one could attain the desirable electrical properties for semiconductors that are unique to diamond. However, initial attempts at producing CVD diamond to be utilized in these technologies failed to live up to expectations. Specifically, in the semiconductor technology, efforts taken up by corporations such as Sumitomo and Toshiba, and by universities including the University of Tokyo failed to produce diamonds of an industry quality that were originally desired.

The art of growing CVD diamond, both mono- and polycrystalline, has undergone rapid change in the last 15 years. Where concern was once had for the quality of CVD diamond, much progress has been made. For instance, recent measurements made at the Naval Research Labs on grown monocrystalline CVD test diamonds indicated that the CVD diamonds were now highly perfect by several means of measurement. First, measurement by x-ray topography indicated a very low dislocation content. Second, measurement of the quantum spin lifetime of the nitrogen atom in a nitrogen-vacancy center (Nv) showed that it had the longest lifetime of any diamond measured, and this lifetime was extended to higher temperatures then previously attained from natural or other synthetic samples.

Without intending to be bound by theory, it would appear that this reported high degree of crystal perfection is likely linked to the high thermal conductivity that can now be achieved, which will be described later in this application, as well as the high electron and hole mobility that can now be achieved, as well as the long collection distance, which are cited in both the previously mentioned DeBeers PCT patent applications. This perfection is also likely linked to the diamond being grown thicker than normal. Since growth of defects in CVD diamond generally takes place in the lateral plane of the diamond during early growth, if the diamond is grown thicker, there is, in turn, a significantly lower level of dislocations present compared with CVD crystals which are grown to only low thicknesses.

The present invention involves methods and compositions for providing "tunable" CVD diamond structures, which can be grown for their use in a variety of applications, including semiconductor devices, optical waveguides, and industrial applications. The present description will include the general preparation or procedures (doping and varying isotope concentrations) that can be followed to grow the tunable CVD diamond structures. In doing so, the properties of the prepared CVD structures are discussed, with preferred and representative applications also being disclosed. Subsequently, particular properties are discussed further in depth, with their preferred values and ranges being provided. In addition, methods of measuring the parameters utilized in the CVD diamond structures are described. Examples of differing preparation methods are provided for preparing the CVD diamond structures. Finally, a discussion of other different applications for the tunable CVD diamond structures is disclosed.

The method and composition of the present invention can be provided in a variety of embodiments, however the use of CVD diamond in this section generally refers to monocrystalline diamond. While not intending to be bound by theory, the method and composition of the present invention, in at least one embodiment, involve doping the CVD diamond as it is produced. In turn, doping comprises incorporating one or more impurities to a diamond as it is being formed by CVD. By doping in this manner, Applicants have found that a diamond can be formed having enhanced properties as compared to similarly prepared diamonds without doping.

The enhanced properties may be electrical, optical, or industrial, as well as others. Some of the impurities that are utilized in doping a CVD diamond may include elements such as boron, nitrogen, lithium, phosphorous, and sulfur. The majority of these impurities are atomically larger in size than carbon atoms. Therefore, when these impurities are added to the diamond, the crystal lattice of the diamond expands. For example, when high levels of boron are incorporated into the diamond, the average distance between carbon atoms in the diamond becomes measurably larger than pure diamond. See, for example, A. R. Lang, "Diffraction and Imaging Studies of Diamond", *The Properties of Natural and Synthetic Diamond*, J. E. Field, editor, Academic Press, pp. 215–258 (1992) and A. R. Lang, "Dilation, density and nitrogen containing type la diamonds: previous work and proposed experiments", IPO Publishing Ltd., pp. 2239–2244 (1993), and F. Brunet et. al., "The Effect of Boron Doping on the Lattice Parameter of Homoepitaxial Diamond Films", *Diamond and Related Materials*, vol. 7, pp. 869–873 (1998). Nitrogen is the lone impurity considered herein that has a covalent radius such that its atomic size is smaller than the carbon atom of diamond. However, even with this, doping a diamond formed by CVD with nitrogen still produces a dilation of the formed diamond. Applicant has discovered that the doping principle can be advantageously used to provide an improved diamond composition in the manner described herein.

The lattice spacing of a crystal refers to the distance between atoms in a particular direction in the crystal. In a particular crystal structure, the lattice spacing is defined by a number of effects, the most important of which for this discussion is the radius of the atoms making up the crystal. In the case of diamond and silicon, the present invention will be concerned with the covalent radii of carbon and silicon, respectively. When an impurity such as a dopant is introduced into a lattice, the lattice will expand if the covalent radius of the dopant is higher than the atoms of the host crystal; conversely, if the dopant is smaller, the lattice will contract. The space occupied by various atoms in a crystal lattice has been highly researched and well documented, as is discussed below. As such, it possible to accurately predict the amount of expansion (or contraction) of the lattice.

The relationship between boron content and the resultant increase in the lattice constant is given by the following equations (see F. Brunet et. al., "The Effect of Boron Doping on the Lattice Parameter of Homoepitaxial Diamond Films", *Diamond and Related Materials*, vol. 7, p. 869 (1998)):

$$a=a_o*(1+1.38\times10^{-7}*[B]), \text{ for } [B]\leq1525 \quad (I)$$

and $$a=a_o*(1-5.6\times10^{-4}+4.85\times10^{-7}*[B]), \text{ for } [B]\geq1525, \quad (II)$$

with a=the lattice constant for doped diamond, $a_o$=the lattice constant for pure diamond, and [B]=the boron concentration in ppma.

The relationship between nitrogen content and the resultant increase in the lattice constant is provided by the following equation (see A. R. Lang, "Diffraction and Imaging Studies of Diamond", *The Properties of Natural and Synthetic Diamond*, Edited by J. E. Field, Academic Press, p. 246 (1992)):

$$a=a_o*(1+1.4\times10^{-7}*[N]), \quad (III)$$

with a=the lattice constant for doped diamond, $a_o$=the lattice constant for pure diamond, and [N]=the nitrogen concentration in parts per million atomic (ppma).

The relationship between phosphorous, sulfur, or lithium content and the resultant increase in the lattice constant is provided by the Vegard's law, which is also sufficient when dealing with boron concentrations less than $2.7\times10^{20}$ cm$^{-3}$. The strain induced by nitrogen cannot be calculated with Vegard's law because, unlike the other impurity atoms considered, nitrogen has a smaller covalent radius than carbon. Vegard's law is provided by the following equation:

$$\Delta a/a_o=B_x*[X], \quad (IV)$$

with $\Delta a/a_o$=the fractional change in lattice constant, $B_x$=the size factor for atom X, and [X]=the atomic density (cm$^{-3}$) for atom X in the diamond. Further, $$B_x=\{r_x-r_C\}/\{r_C*[C]\}, \quad (V)$$

with $r_x$=the covalent radius for atom X, $r_C$=the covalent radius for carbon=0.77 Å, and [C]=the atomic density of carbon in the diamond=$1.76\times10^{23}$ atoms/cm$^3$. In using Venard's law, the covalent radius and size factor for boron (B), sulfur (S), phosphorous (P), and lithium (L), as well as for (Nd) neodymium, are provided in Table 1 below.

TABLE 1

| Atom (X) | Covalent Radius ($r_x$) (angstroms) | Size Factor $B_x$ | Comment |
|---|---|---|---|
| B | 0.88 | $8.12\times10^{-25}$ | Empirical fit of experimental data from Brunet, et. al. fits Vegards law for [B] < 2.7 × 10$^{20}$/cm$^3$ |
| S | 1.04 | $1.99\times10^{-24}$ | |
| P | 1.10 | $2.44\times10^{-24}$ | |
| Li | 1.34 | $4.21\times10^{-24}$ | |
| Nd | 1.64 | $6.42\times10^{-24}$ | |

The above-mentioned equations can also be used to assist in the design of multi-layer structures which are lattice matched or which have a layer or layers with a tailored lattice mismatch. If, for instance, a thin boron-doped diamond layer is grown on a normal diamond substrate, the surface spacing of the carbon atoms of the doped layer would normally be larger than those of the substrate. Thus, the lattices of the substrate and the thin diamond layer would be mismatched, or not aligned. However, the thin layer may be constrained from expanding by the lattice of the substrate if the substrate is thicker than the thin layer. In this scenario, the thicker layer would be the dominant layer of the structure and the other layers, i.e., the thin layer, would be forced to align. If the substrate is indeed the dominant layer, the thin layer will be placed under compression, while the underlying diamond substrate will be placed in tension. Applicant has found that this results in strengthening the surface of the diamond and making it more resistant to cracking or other mechanical failure. This feature can be advantageously used to strengthen a large number of single crystal diamond articles such as cutting tools, surgical knives, microtomes, wire dies and so forth.

In addition to doping during crystal growth, other processes exist for doping semiconductors in general, and diamond in particular, including diffusion and ion implantation. Each has particular characteristics which make them desirable to use in specific circumstances. Both methods of doping will enlarge or expand the crystal lattice of diamond.

In the case of diffusion, the element desired in the lattice is placed on the diamond surface in some form such as gas, solid or liquid and the element is caused to diffuse (migrate) into the surface by the application of thermal energy or electric field energy. The depth and intensity of the diffusion will be related to the temperature, time and species of the source. In diffusion, the concentration follows an exponential relationship with time and therefore the lattice dilation will follow a corresponding relationship with the surface being more heavily dilated than the interior.

In ion implantation, the desired species is accelerated to the diamond surface as an ion, in high vacuum, and the ion penetrates the diamond surface to a depth which is determined by the accelerating voltage. This layer can be tenths of micrometers below the diamond surface and be an additional tenths of micrometers thick and will exhibit the dilation of lattice in the same manner as described above. A series of implants of varied voltage and dose can also be used to give a doping level profile with depth which is desired for the application. In addition, ion implantation of even non-dopant atoms causes dilation of the lattice due to the damage which is done to the lattice by the ion impacts during implantation. This lattice dilation occurs when the beam passes through the surface and therefore can leave an undoped dilated layer on top of a doped dilated layer.

Single crystal growth by CVD on the undoped dilated layer results in a buried strained layer in the crystal at the level where the initial implant entered the crystal. Diamond is uniquely suited to producing this type of buried layer since the damage produced does not anneal out during the subsequent growth on the layer, as it would with other semiconductor materials. Such a strained layer would have a different index of refraction than the bulk of the crystal and thereby could serve as an optical waveguide. Methods to make these layers and articles will be discussed later.

The strain energy due to lattice mismatch ($\epsilon=(a_o-a_f)/a_o$, with $a_o$=substrate lattice constant and $a_f$=layer lattice constant) can be estimated using the equation:

$$\text{Energy}=t*E*\epsilon^2/(1-v), \quad \text{(VI)}$$

with t=film thickness, E=Young's modulus, and v=Poisson's ratio (for example, see C. R. M. Grovenor, *Microelectronic Materials*, Adam Hilger, p. 139 (1989)). This equation, along with the equations which give the lattice constant change due to impurity addition, can be used to produce a layer or layers with a tailored strain energy.

As previously mentioned, doping generally leads to atomic expansion dilation in the atomic lattice structure. While this expansion is typical, it is also very important to control because if a diamond is doped excessively, the corresponding lattice structure of the diamond will be put under significant strain. Based on how much the diamond is doped (and strained), there is in turn a critical thickness to which the diamond can be formed. If the diamond is heavily doped, and subsequently grown to a thickness that exceeds the critical thickness, the diamond will have a strain level severe enough such that a formation of dislocations starts to occur in the diamond layer, followed potentially by a fracturing of the diamond. Generally, the formation of dislocations degrades the properties and performance of a device incorporating the diamond.

When forming multi-layered diamond structures, as previously discussed, strain can occur in one or more of the layers. In turn, the strain, if different in both layers, will often cause the atomic lattices of the one or more layers to be mismatched, or not aligned. Much like when doping a single diamond film layer, the strain created by each of the lattice-mismatched layers will only be accommodated up to some critical thickness; thereafter, the strain on each layer will be relieved by the generation of dislocations or if still greater strain is applied, by a fracturing or a cracking of the film in the layer. The critical thickness can be predicted by using the physical and mechanical properties of the material and the calculated lattice mismatch between the substrate and the film.

One can estimate the critical thickness of a diamond as a function of the structure's lattice mismatch (see, generally, S. M. Sze, "The Ideal Semiconductor: A Wish List", *High Speed Semiconductor Devices*, editor, Wiley-Interscience, p. 30 (1990)):

$$L_c=b^2*(1-v)/(8\pi*w*f^2)*[ln(L_c/b)], \quad \text{(VII)}$$

with $L_c$=critical thickness (mm), b=Burger's vector, $v$=Poisson ratio, w=Fitting parameter, and f=fractional lattice mismatch ($\Delta a/a_o$). In regards to doping diamond with Boron, this equation can be used to generate critical various thicknesses, contained in Table 2 below, based on differing dopant concentration. In turn, when this data is plotted, as illustrated in FIG. 1, it can be observed that critical thickness varies inversely with strain, or lattice mismatch.

TABLE 2

| $\Delta a/a_o$ | Crit T (A) | Crit T (fit) | Crit T (um) | Comment |
|---|---|---|---|---|
| 0.00001 | 6.46E+09 | 6.47E+09 | 645739.4 | |
| 0.0001 | 4.98E+07 | 4.98E+07 | 4983.157 | |
| 0.00015 | 2.10E+07 | 2.10E+07 | 2098.487 | |
| 0.001 | 3.48E+05 | 3.49E+05 | 34.80513 | |
| 0.002 | 7.54E+04 | 7.54E+04 | 7.540937 | [B] = 1e21 |
| 0.0049 | 1.00E+04 | 1.00E+04 | 1.001428 | [B] = 2e21 |
| 0.01 | 1.90E+03 | 1.90E+03 | 0.190138 | |

Thus, it is possible to calculate the critical thicknesses of diamond films of various compositions, and in turn, it is possible to deliberately grow diamond films having desired levels of strain. As can be seen from Table 3 below, using the equations (I)–(V) above, differing amounts of strain can be approximated for various impurity atom concentrations.

TABLE 3

| Impurity (atoms/cc) | ($\Delta a/a_o$) Boron | ($\Delta a/a_o$) Sulfur | ($\Delta a/a_o$) Phosphorous | ($\Delta a/a_o$) Lithium | ($\Delta a/a_o$) Neodymium |
|---|---|---|---|---|---|
| 1.00E+18 | 8.12E−07 | 1.99E−06 | 2.44E−06 | 4.21E−06 | 6.42E−06 |
| 5.00E+18 | 4.06E−06 | 9.95E−06 | 1.22E−05 | 2.11E−05 | 3.21E−05 |
| 1.00E+19 | 8.12E−06 | 1.99E−05 | 2.44E−05 | 4.21E−05 | 6.42E−05 |
| 5.00E+19 | 4.06E−05 | 9.95E−05 | 1.22E−04 | 2.11E−04 | 3.21E−04 |
| 1.00E+20 | 8.12E−05 | 1.99E−04 | 2.44E−04 | 4.21E−04 | 6.42E−04 |
| 5.00E+20 | 4.06E−04 | 9.95E−04 | 1.22E−03 | 2.11E−03 | 3.21E−03 |
| 1.00E+21 | 8.12E−04 | 1.99E−03 | 2.44E−03 | 4.21E−03 | 6.42E−03 |

These strained films are referred to as pseudomorphic films. For example, the strain levels in structures based on Silicon-Germanium alloys (see, generally, S. M. Sze, "The Ideal Semiconductor: A Wish List", *High Speed Semiconductor Devices*, Wiley-Interscience, pp. 28–33 (1990)) have been shown to be equivalent to pressures of thousands of atmospheres. Under these conditions, significant alteration of the basic properties of the material is achieved, e.g., the bandgap. However, the use of Silicon-Germanium alloys permitted the attainment of properties which could not be created by any other means; therefore, the reduction in bandgap has been utilized and controlled to advantage by materials and device designers. In the Silicon-Germanium systems, the alloys are between two dissimilar elements having two differing atomic lattice structures. In contrast, in diamond, we can make alloys between similar elements $^{12}C$ and $^{13}C$ diamond and between diamond and dopants.

By doping CVD diamond films in a specific manner, one can lessen or even eliminate diamond dislocations. Dislocations are simply discontinuities in the arrangement of the atoms from perfect order. The dislocations usually travel in straight lines and therefore extend from the substrate into the film or crystal grown on the substrate. It has been demonstrated on conventional semiconductors that when a dislocation intersects with a layer that is in compression or tension, the dislocation will change direction and run at an angle different from its original direction and even run in the plane of the growing crystal. (See J. Y. Tsao et al., "Critical Stress for $Si_x$—$Ge_{(1-x)}$ Strained-Layer Plasticity", *Physical Review Letters*, 59 (21), pp. 2455–2458, 23 Nov. 1987).

By making a series of thin layers that are alternately in compression and tension, the propagation of dislocations can be reduced or completely halted. (See Y. C. Chen et al., "Suppression of defect propagation in semiconductors by pseudomorphic layers", *J. Applied Physics*, 74 (6), Sep. 14, 1993). Applicants have found that this process can be extended to diamond by growing layers that are alternately doped, e.g., boron doped, and not doped. A significant advantage to this invention is that in bulk growth, a non-trivial amount of growth has to occur in order to grow out dislocations, however in the present invention, the dislocations are removed in one or a small number of dislocation blocking thin films and thereafter any additional thin films will remain dislocation free.

The method of the present invention can be used to prepare low-dislocation or dislocation-free diamond crystals, substrates, and structures. The method can also be used to prepare strain-free optical elements made from low or dislocation free diamond. Strain results in birefringence that generally degrades the performance of optical elements such as lenses and windows and gemstones. Using the invention, optical elements, e.g., windows, can be prepared for lasers, wherein the active laser medium, e.g., Nd:YAG, is formed to a unstrained, lattice-matched, CVD diamond window or where Nd, i.e., neodymium, has been incorporated into the diamond by methods which will be described later.

The method further permits the production of low-dislocation or dislocation-free substrates for semiconductor devices. It is known in silicon, and has been reported in diamond, that impurities can accumulate on dislocations that leads to localized degradation of device performance. For example, it has been shown that crystallographic defects in boron doped diamond limit the performance capabilities of diamond LEDs. (see S. Koizumi et. al., "Ultraviolet Emission from a Diamond pn Junction", *Science*, vol. 292, pp. 1899–1901(2001)).

The present invention therefore also includes higher performance devices using substrates and films with low dislocations and made by a method as described herein. One particular noteworthy application for unstrained, lattice matched CVD diamond would pertain to quantum computing. Diamond is of considerable interest in regards to quantum computing due to the fact that an impurity related center (the N-V center containing a substitutional nitrogen impurity and a vacancy) is utilized and possesses properties making it suitable for use as a q-bit. Along with spin state interaction, another critical property in quantum computing is the lifetime of the spin state used in q-bit operation, and this lifetime is directly related to the crystallographic quality of the diamond (T. A. Kennedy et. al., "Single Q-bit Operations with the Nitrogen-Vacancy Center in Diamond", to be published in *Phys. Stat. Sol. B* (2002)).

By doping CVD diamond with boron, one can also effectively vary its electrical conductivity. Applications include the following:

1. Boron doped diamond undergoes a change in electrical resistivity when it is placed under compression or tension and when it changes temperature. Therefore, the method of the present invention can be used to coat a single crystal diamond tool with boron doped single crystal diamond, and measure the stress on the tool under operation and its temperature. This, in turn, can be used to provide an in situ sensor for monitoring and controlling a machining operation, permitting it to operate in an optimal manner. This feature can also be adapted for use in providing mechanically guided surgical blades for minimally evasive types of surgery.

In yet another embodiment of the invention, the cutting layer could contain alternating layers of p type (positively charged with boron dopant) or n type (negatively charged with phosphorous dopant) diamond, creating a tool that is also a p-n junction. Such a layer could provide continuous, in-situ monitoring of the tool performance, vibration, wear and so forth during the cutting cycle. Such a device could also be used in surgery to provide information regarding the surgical procedure such as location. A further embodiment would be to have an entire transistor or detector grown onto the surgical blade to monitor location, blood flow, blood and tissue chemistry and so forth.

2. The use of conducting, boron doped diamond in surgery will reduce the possibility of electrical discharge from the surgical blade caused by static electricity and thereby prevent damage to the patient or surrounding electrical monitoring equipment or implanted devices such as pacemakers.

3. Diamond can be used to slit materials such as plastic film, paper and the like or cut tissue thin sections in a microtome. A common problem with such process is the accumulation of static electricity that leads to catastrophic electrical discharge or accumulation of dust, dirt and cutting residue on the cut surface. Boron doped diamond surfaces on the tool can be used to prevent such static buildup. In some cases it might be desirable to use an entire tool of solid boron doped diamond rather than a film or multi-layer structure.

4. Boron doped diamond is highly resistant to corrosion in acidic or basic aqueous solutions. Boron doped polycrystalline diamond has been used as electrodes for electrochemical synthesis of materials such as oxygen and chlorine. Polycrystalline diamond electrodes have a lifetime that is many times that of conventional electrode materials such as graphite or stainless steel. However, polycrystalline diamond undergoes catastrophic failure at many hours of operation. Polycrystalline diamond is composed of millions of tiny crystallites which connect to each other at grain boundaries. These grain boundaries tend to accumulate impurities which are slowly attacked leading to the failure. Applicant has produced electrodes made of single crystal boron doped diamond. These electrodes have no grain boundaries and have life times which are significantly longer than polycrystalline diamond and show uniform wear, but no catastrophic failure. Moreover, single crystal diamond electrodes can withstand several orders of magnitude higher current density than polycrystalline diamond can without catastrophic failure or measurable erosion.

Finally, a composition of this invention can provide unique and specific semiconducting properties useful, for example, in fabricating such things as tools, microtomes, cutting tools for detectors, and the like.

A primary advantage that monocrystalline CVD diamond has over other forms of diamond crystal, whether natural or synthetic formed by high pressure high temperature, is that the CVD diamond can be grown with consistent impurity levels, and thus, consistent properties. Thus, for example, when it is known that the wear rate of diamond tools is directly proportional to the nitrogen content of the diamond, one can manipulate the doping to produce the warranted diamond structure utilizing the "lattice constant" and "critical thickness" equations given above. In turn, a tool having a very low wear rate can be made by growing a very high purity diamond by the CVD method of the invention. Moreover, since a CVD crystal will contain no metallic inclusions and other defects, the crystal can be polished to a higher degree of smoothness to produce a sharper cutting edge for a cutting tool, and a smoother surface for a wire die, wear plate or bearing.

A high quality and high purity CVD single crystal diamond layer can be grown on a natural or high pressure synthetic diamond seed crystal. Therefore, a diamond crystal with enhanced hardness, thermal conductivity and polishing surface can be grown. This composite crystal, consisting of a CVD synthetic single crystal diamond layer on a natural or high pressure synthetic diamond, will result in a crystal, which has superior performance to a natural or high pressure diamond crystal by themselves. Moreover, the subject method can be utilized to recoat cutting tools or other articles which have become worn out through normal use.

Applications include but are not limited to single crystal diamond cutting tools (often referred to as single point diamond tools (SPDT) to cut plastic lenses and molds for contact lenses, metallic and plastic mirrors for a wide range of high and low performance optics, high speed precision cutting of wood and wood laminates for furniture and general construction, precision cutting of non-ferrous metals and so forth. An important feature of SPDT is that very smooth surfaces can be machined at high speed, often to obtain an optical finish without subsequent polishing or finishing. SPDT provide such a finish with only one pass of the cutting tool and despite the higher cost of diamond compared with carbide, steel or ceramic cutting tools, provides a lower cost cut than these alternate tools. Given the superior cost benefit of SPDT compared with other cutting tool material, an additional benefit arises because of the vastly superior hardness of diamond tools.

In high speed and precision cutting processes, a significant cost is associated with the down time of the cutting machining when a tool wears out and no longer produces parts of the required tolerance. When applied to the cutting of wood laminate products, for example, the factory must forgo the production of thousands of board feet of product while the tool is being replaced and realigned. Therefore, SPDT gives many benefits to material fabricators in the form of higher quality product with fewer production steps and lower production losses due to down time. Both of these benefits arise because of the superior hardness of diamond and smoother cutting surfaces. Therefore, any method which can increase the hardness of diamond will immediately translate into significant economic benefit to the user of such SPDT having increased hardness. SPDT which have been made as a composite of high purity single crystal CVD grown diamond and a lower purity diamond will fulfill those properties described above and result in superior SPDT to synthetic or natural diamond alone.

Applicants have also observed an improvement in hardness, wear rate, and oxidation resistance when a CVD, HPHT, or natural diamond is coated with a thin layer of boron doped diamond. Without intending to be bound by theory, it would appear that when boron is added to the diamond lattice, the lattice expands and when the thickness of the layer is below the critical thickness, the surface being in compression actually makes surface stronger and harder. I would appear that when a heavily boron doped layer is grown to a thickness below its critical thickness, that the composite diamond has an abrasion rate which is significantly below even that of pure CVD grown single crystal diamond.

Indeed, when a boron coated and uncoated diamond are polished simultaneously on the same diamond cutting wheel, the polishing rate in the same crystallographic direction was less than one fourth to one half on the Boron doped diamond surface. Applicants have also found that a significantly reduced etching rate in oxygen or air at temperatures of 650 degrees Celsius and higher. A further extension of the invention cited above is to further harden CVD, HPHT, or natural single crystal diamond cutting tools by coating them with a highly boron doped film which is below the critical thickness, thereby improving the performance of the tool, prolonging its life and bringing about a significant improvement in economic benefit to the user of the tool.

As earlier stated, when the critical thickness is exceeded, the strain energy will be relieved by the formation of dislocations. When a boron doped layer is grown to a thickness which exceeds the critical thickness, high dislocation densities are generated. The presence of high densities of dislocations can block the propagation of cracks in the crystal during cutting or other physical impact and in effect strengthen the crystal. Therefore, Applicants have discovered that by growing a heavily boron doped diamond layer which is thinner than the critical thickness will have superior hardness, wear, tool life and economic benefit. Likewise, by growing a heavily boron doped layer which is thicker than the critical thickness will have superior impact resistance, resistance to cracking and be able to tolerate higher pressure or tool feed rate than pure SPDT. Therefore it will be possible to create tools which are tailored to specified applications by creating boron doped layers which are greater or lesser than the critical thickness.

It is also possible to grow heavily boron doped diamond films in which part of the film is below than the critical thickness and part of the film is above the critical thickness. Such a composite will have part of its surface made harder and longer lived, while a different part of the surface will be tougher. In turn, the composite offers all the advantages of the harder tool while still having the advantages of being tough. Such a tool would be constructed such that during material cutting, the first part of the tool to touch the work will be the part with the high dislocation density (thicker than the critical thickness). This part of the crystal can withstand higher pressure and cutting rate and will remove the bulk of the material, but with less than perfect precision. As the tool moves into the material, after the bulk of the material has been removed the second part of the tool will touch the material and the final finish will be put on by the boron coated diamond layer which is less than the critical thickness.

It will be understood by those acquainted with the art of designing tools, that the two functions can be accomplished by changes in angle of the diamond cutting surfaces as one progresses from the thick to the thin part of the tool. It is also possible to produce such an improved tool by growing a thick boron doped layer on CVD, HPHT, or natural diamond and receive the benefit of the higher impact resistance due to the high dislocation density of the thick boron doped layer. It can be well understood by one acquainted in the art, that other impurities than boron could be used to bring about hardening at film thickness lower than their critical thickness or creating toughened films by growing films at a thickness greater than the critical thickness. Any of these embodiments can be used to coat existing SPDT and improve their performance.

It is recognized that the use of this invention is not limited to Single Point Diamond Tools, but can be extended to other single crystal diamond applications where wear rate, smoothness, impact resistance and so forth are desirable. This would include but not be limited in applications such as medical scalpels, knives, microtomes, wire dies, bearings, wear plates, spacers.

While not intending to be bound by theory, the method and composition of the present invention, in at least one embodiment, involve varying the isotope concentrations of carbon in CVD diamond as it is produced. In general, the essence of this technique involves the spacing between carbon atoms to be decreased rather than increased. Carbon is found in several isotopes. $^{12}C$ is the most common isotope while $^{13}$C is about 1% abundant. Diamond that consists of all $^{13}$C atoms has a smaller spacing between the carbon atoms than normal diamond (which contains 99% $^{12}$C and 1% $^{13}$C). The dependence of the lattice constant on the isotope content of the diamond is given by the equation:

$$a = a_o - 5.4 \times 10^{-9} * [^{13}C] \quad\quad (VIII)$$

where a=the lattice constant of the isotopically enriched diamond, $a_o$=the lattice constant for pure diamond, and [$^{13}$C]=the atom fraction of $^{13}$C (see, H. Holloway et. al., "Erratum: Isotope dependence of the lattice constant of diamond", *Physical Review* B45, p. 6353 (1992)).

Therefore, as with a doped layer being grown on a natural undoped diamond layer, it is possible to deposit a layer of $^{13}$C diamond on a $^{12}$C substrate and place the $^{12}$C diamond under compression and the $^{13}$C surface layer under tension. This, in turn, leads to the following:

1. Diamond plates or crystals can be strengthened (in the bulk) with the application of a single layer, and without boron or nitrogen doping.

2. A heterostructure can be created to diminish dislocations without using boron or nitrogen doped layers. This heterostructure can include alternating layers of undoped $^{12}$C and $^{13}$C diamond. Such a structure can end in either a $^{12}$C or a $^{13}$C layer and then be used to grow single crystal plates of either $^{12}$C or $^{13}$C diamond.

3. A layer of continuously varying $^{12}$C/$^{13}$C can be generated to change from one lattice spacing to the other, thereby providing substrates for large $^{13}$C diamond crystals.

4. Since the atoms in $^{13}$C are closer together than conventional diamond, the $^{13}$C diamond is expected to be harder than conventional diamond, to the extent that one can use $^{13}$C bulk crystals or layers in situations where it is necessary to abrade, scratch, indent or wear normal diamond.

5. It has been shown that CVD diamond which has less than 0.1% of $^{13}$C impurities (referred to as isotopically enriched) has an exceptionally high thermal conductivity. By growing a layer of boron doped isotopically enriched diamond on ordinary diamond, it is possible to build a semiconductor device in which heat was spread laterally at a high rate and then axially down into a heat spreader. The same could be applied to undoped isotopically enriched diamond on ordinary diamond for the purpose of rapid lateral removal of heat and then removing it axially to a heat spreader. Such a structure can lead to better temperature control in communications lasers and other high power devices. In addition, alternating layers of ordinary diamond and isotopically enriched diamond can lead to a structure which has an extremely high lateral thermal conductivity compared to the vertical conductivity.

6. Since $^{12}$C and $^{13}$C have different mass, changes in isotope content change the bandgap of the diamond with a corresponding change in electrical properties. (see A. T. Collins et. al, "Indirect Energy Gap of $^{13}$C Diamond", *Physical Review Letters*, 65, p. 891 (1990)). The band offset and resultant change in electrical properties can be used to make electrical and optical devices which are not possible without these offsets.

7. As previously mentioned, natural diamond is composed primarily of 99% $^{12}$C, with about 1% $^{13}$C. Pure $^{13}$C diamond has a smaller lattice constant than natural diamond, and this is due to the smaller covalent radius of $^{13}$C. Thus, if one creates alloys of composition ranging from pure $^{12}$C to pure $^{13}$C diamond, the lattice constant will decrease as the $^{13}$C content is increased. Therefore, since $^{13}$C shrinks the diamond lattice and boron or nitrogen dilates the lattice, it is possible to create a composition consisting of $^{12}$C, $^{13}$C, and heavy concentrations of boron or nitrogen (boron doping results in p-type semiconductor which is required for many devices). This is because one can now combine the expanding effect of large dopant atoms with the contracting effect of $^{13}$C to produce a layer of diamond which is exactly lattice matched to a natural diamond substrate.

In particular, if a $^{13}$C diamond layer is grown on a $^{12}$C diamond, there will be strain in the $^{13}$C layer, as already described. If we then dope the $^{13}$C diamond layer by diffusion (thermal or electrical) or by ion implantation, the dopant will expand the lattice of the $^{13}$C diamond and the strain will be diminished. Therefore, one could create a layer consisting of variable $^{12}$C and $^{13}$C isotope concentrations with heavy concentrations of a dopant, e.g., boron or nitrogen (boron doping results in p-type semiconductor which is required for many devices). The composition can be engineered, i.e., by varying the $^{13}$C isotope (between 0.1 and 100%) with, for example, a quantity of boron dopant (between 0 and 1%), to exactly match lattice spacing of an ordinary natural diamond layer and provide structures which have the heavy boron concentration required for device performance but have no lattice structure strain. This approach will provide an unstrained such as is used in III–V semiconductor structures.

Examples showing the required isotope mix ($^{13}$C %) necessary to produce specific device structures having zero strain are shown in Table 4 below. For more information on the specific devices mentioned, see Aleksov et al., "Diamond Junction FETs based on δ-doped channels", *Diamond and Related Materials*, vol. 8, pp. 941–945 (1999), A. A. Melnikov et al., "Electrical and Optical Properties of Light-Emitting p-i-n Diodes on Diamond", *J. Appl. Phys.*, vol. 84, pp. 6127–6134 (1998), and S. Koizumi et al., "Ultraviolet Emission from a Diamond pn Junction", *Science, vol.* 292, pp. 1899–1901 (2001). Applicants have applied the lattice matching/strain minimization aspects of the invention to what has been referenced in regards to the electrical devices to make the following devices with diamond.

TABLE 4

| DEVICE (REFERENCE) | DOPANT | CONCENTRATION | REQUIRED $^{13}$C % |
|---|---|---|---|
| delta doped FET (Aleksov et al.) | B | 5.00E+19 | 25 |
| PIN LED (Melnikov) | B | 1.00E+20 | 51 |
| PIN LED (Melnikov) | Li | 5.00E+19 | 100 |
| p/n LED (Kolzumi et al.) | P | 7.50E+18 | 11 |

Also, this lattice matching notion can be expanded to growing a multi-layered diamond structure being primarily comprised of layers of doped diamond that are lattice matched to each other. Such a structure would be created with few natural diamond layers, if any at all. Layers would be precisely grown having appropriate $^{12}$C and $^{13}$C concentrations to mesh with the desired doping concentrations of boron, nitrogen, lithium, phosphorous, sulfur or other impurity, to produce a diamond structure which is free of strain. The concentration of $^{12}$C/$^{13}$C could be continuously varied to follow the diffusion of ion implantation curve and give an undistorted and unstrained lattice over wide depths of doping. This method can also be applied to situations where it is desirable to deposit diamond and ion implant simultaneously as is done with silicon. This could lead to higher doping levels and the incorporation of elements which cannot now be incorporated into diamond. Such elements could include but not be restricted to neodymium (Nd) which is the most effective solid state laser material and which could lead to much higher power Nd lasers for welding, cutting, laser weaponry, LIDAR, visible and UV laser pump sources, medical diagnostics and military target designation.

In combining equation no. VIII, concerned with the dependence of the lattice constant on the $^{13}$C isotope concentration of the diamond, with any one of the previously mentioned equations nos. I through V, concerned with the dependence of the lattice constant on the dopant concentration of the diamond, one can accurately predict the maximum concentration of various impurities which can be accommodated in $^{13}$C diamond and still be lattice matched to normal diamond. The results of this calculation are shown in Table 5 below. It is important to note, that the level of impurity which can be accommodated in $^{13}$C diamond film grown on natural isotope concentration diamond is significantly higher than what can be accommodated in a natural isotope diamond film that is grown on a natural diamond isotope substrate while still maintaining low strain. By combining the equations previously mentioned, one can calculate the full range of $^{13}$C and dopant concentrations which will produce films which can be lattice matched to natural diamond substrates.

TABLE 5

| % $^{13}$C | B | N | S | P | Li |
|---|---|---|---|---|---|
| 10 | 2.15E+19 | 3.87E+19 | 8.42E+18 | 6.89E+18 | 4.00E+18 |
| 25 | 5.06E+19 | 9.26E+19 | 1.98E+19 | 1.62E+19 | 9.39E+18 |
| 50 | 9.91E+19 | 1.81E+20 | 3.88E+19 | 3.17E+19 | 1.84E+19 |
| 100 | 1.96E+20 | 3.59E+20 | 7.66E+19 | 6.28E+19 | 3.63E+19 |

Figure 2:
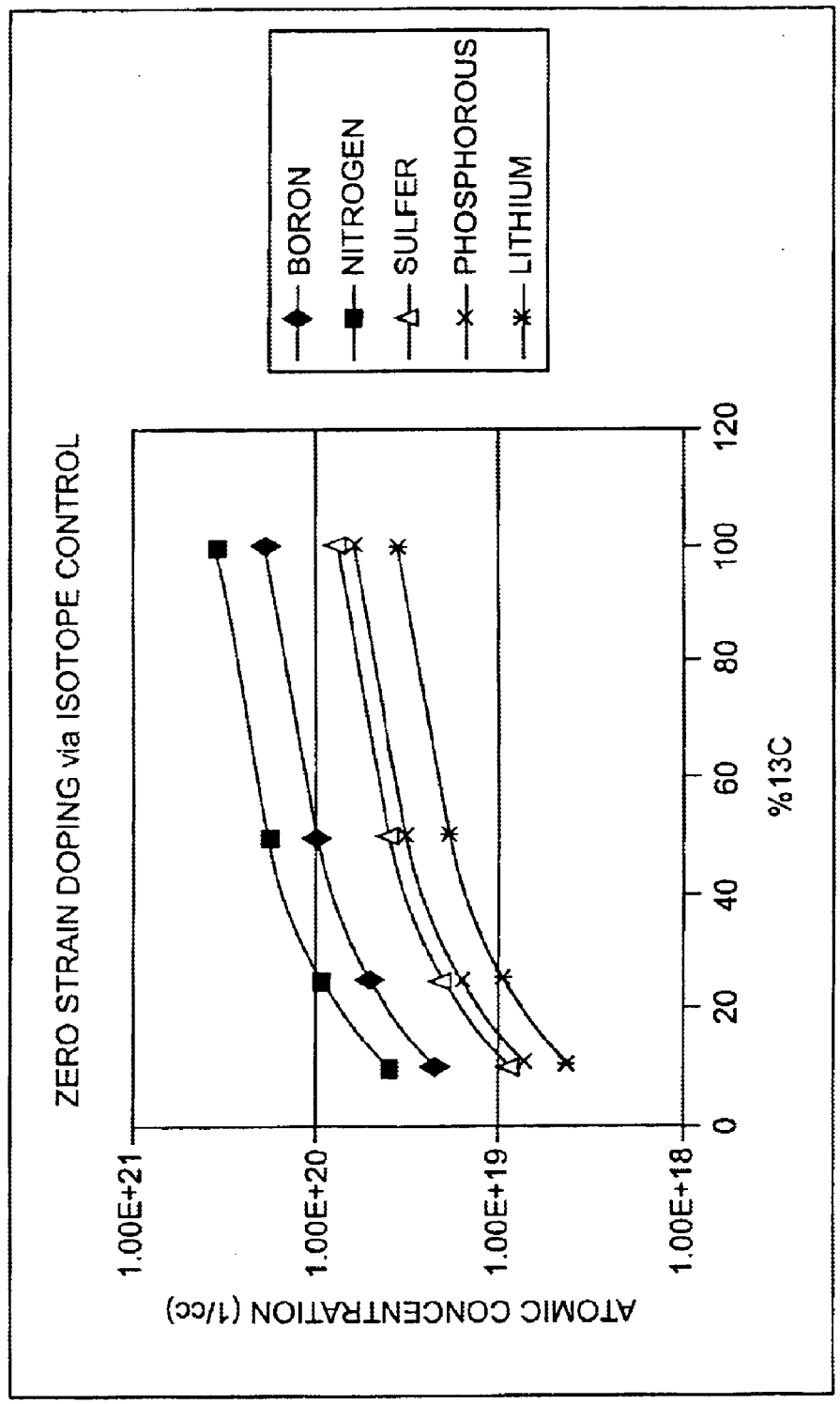
FIG. 2 is a graph showing impurity atomic concentrations versus % $^{13}C$ necessary to achieve zero lattice strain for differing embodiments of the invention.

FIG. 2 shows such a plot for the dopants of boron, nitrogen, sulfur, phosphorous, and lithium doping. In this figure, compositions which lie on the line will be lattice matched to normal isotope or pure diamond. These are the major dopants being considered for use in diamond, however the same principle would apply to other dopants which might be discovered or developed in the future. This plot along with the equations alluded to earlier can therefore be used to design diamond layers for semiconductors, optical waveguides, or other related applications which necessitate layers to be latticed matched.

8. Alternately, a pseudomorphic diamond structure can be built in which layers are alternately in compression and tension, in which any layer can be doped with boron (or some other impurity). In particular, only one of the layers needs to be in compression or tension, with all the other layers being lattice matched. In these structures, a layer is produced having a desired amount of strain from the lattice mismatch. Subsequently, the variance in electrical and device properties arises from the strain induced electrical discontinuity from the at least one layer under strain. Such a pseudomorphic structure could be built using a minimum number of grown layers by using ion implantation and diffusion along with doping (active [B, N, S, Li, P, or other elements] or $^{13}$C) to achieve the strain discontinuities desired.

In regards to creating optical waveguides, diamond layers which are doped using conventional dopants and/or by using $^{13}$C carbon doping can be grown between layers of normal diamond. In doing so, it is possible to grow encapsulated diamond layers which are either in compression or tension. Similarly, a similarly doped diamond layer can be grown on the surface of the diamond and can be in compression or tension. Diamond films with high doping and having a thickness less than the critical thickness can contain compressive stresses equivalent to isostatic pressures measuring thousands of atmospheres. Under these conditions, a change in index of refraction of approximately 0.04% is usually obtained when 1000 atm pressure is applied (see M. A. Prelas et al., *Handbook of Industrial Diamond and Diamond Films*, Marcel Dekker, Inc., p. 231 (1998)). These strains are sufficient to enable index of refraction changes which can guide optical beams in either clad layers or surface layers. Of particular interest to designers of optical devices, routers and other devices is the fact that diamond has the widest optical transmission range of any material. Thus, it would be possible to make optical waveguides which transmit from the ultraviolet to infrared ranges of the spectrum making optical computing, routing and other devices possible over new and important regions of the spectrum.

In addition to guiding and routing devices over large wavelength ranges, diamond waveguides can be produced which will guide the light from diamond light emitting diodes in the ultraviolet to a range of devices. Such optical waveguides and also be made in conjunction with surface acoustic wave devices to use a microwave acoustic signal to deflect and route optical signals which are flowing through the optical waveguides. Such a merger of acoustic and optical waveguide properties in diamond films and structures will lead to novel methods of optical signal processing, optical routing and building integrated optical devices. Additional devices which can be built on diamond films and waveguides are integrated optical computers (based on quantum computing) along with rf or microwave pumps to generate the necessary quantum spins and waveguides to direct the optical output signals to detector arrays or other computer devices.

Medical devices such as scalpels can be improved by growing films of highly doped diamond which are below the critical thickness on each side of the device. The films will put both be in compression and sill significantly strengthen in scalpel or other device. The same principle can be applied to other types of diamond knives such as those used to slip paper or plastic or other high volume material which repeatability, low wear and high throughput with low process off time are required.

Again, in reference to FIG. 2, compositions that are lying above the dopant curves will have layers which are under compression, while compositions lying below the curves will have layers which are in tension. This plot along with the equations alluded to earlier can therefore be used to design diamond layers for semiconductors, optical waveguides, or other related applications which necessitate layers to be in compression or in tension. Typically, when one is considering the precision required for the composition, it will involve factoring in how little compressive or tensional strain can be accommodated or is indeed required for a particular application.

9. Phosphorous has been shown to be a n-type dopant in CVD diamond (see S. Koizumi et al., "Growth and characterization of phosphorus doped n-type diamond thin films", *Diamond and Related Materials*, 7, pp. 540–544 (1998)). However phosphorous is a significantly larger atom than carbon, nitrogen or boron (covalent radius of P is 1.57 times larger than N and 1.25 times larger than B) (see K. W. Boer, *Survey of Semiconductor Physics*, van Nostrand, p. 25 (1990)), and this places limitations on the amount of phosphorous which can be incorporated into the diamond and limits its potential electrical performance in a device. Since $^{13}C$ shrinks the diamond lattice and phosphorous expands the lattice, it is possible to create an alloy composition consisting of $^{12}C$, $^{13}C$ and heavy concentrations of phosphorous. This, in turn, can lead to higher phosphorous concentrations which are more suitable for device performance.

10. Sulfur has been shown to be a n-type dopant in CVD diamond (see M. N. Gumo et al., "Sulfur: A New Donor Dopant for n-Type Diamond Semiconductors, *Applied Diamond Conference/Frontier Carbon Technology Joint Conference*, p. 54 (1999)). However, sulfur is a significantly larger atom than carbon, nitrogen or boron (atomic radius of S is 1.49 times larger than N and 1.09 times larger than B) (see J. F. Shackelford et al., *CRC Materials Science and Engineering Handbook*, CRC Press, p. 18 (1994)), and this places limitations on the amount of sulfur which can be incorporated into the diamond and limits its potential electrical performance in the device. Since $^{13}C$ shrinks the diamond lattice and sulfur expands the lattice, it is possible to create an alloy composition consisting of $^{12}C$, $^{13}C$ and heavy concentrations of sulfur. This, in turn, can lead to higher sulfurous concentrations which are more suitable for device performance. 11. By the combination of the items 8 and 9 (or 8 and 10) and growing a layer of boron doped diamond and subsequently a layer of phosphorous or sulfur doped diamond one can create a p-n junction which is necessary for many semiconductor devices. The advantage of using the alloy compositions is to obtain very high levels of electrically active carriers which will enable the operation of traditional semiconductor devices in diamond. As previously described, diamond semiconductor devices are expected to operate at higher power levels, higher temperatures and higher speeds than any other semiconductor device material.

12. The method of this invention can be used to grow a synthetic monocrystalline diamond from normal isotope carbon and intersperse layers of $^{13}C$ diamond for the purpose of providing a marker for identifying the origin of the diamond as being CVD monocrystalline diamond for use in specific articles such as gemstones, e.g., where it is desirable to prevent confusion between natural and CVD grown monocrystalline diamond. Alternately, the entire monocrystal can be grown with a small amount of $^{13}C$ carbon and also provide a method of detection. Such a method of detection would be high resolution x-ray diffraction, Raman spectroscopy, and mass spectroscopy, each of which can be used to measure isotope content. The Raman method, for instance, will show small changes in the crystal structure caused by enlarging or decreasing the lattice spacing.

In some regards, CVD diamond is substantially the same as natural or high pressure diamond. One embodiment of the present invention involves providing monocrystalline diamond in the form of plates or other substrates that can be used as the beginning step for producing a large number of diamond manufactured articles. The method of the invention can also be used to eliminate a substantial number of fabrication steps such as sawing and lapping and increased yield of useful product. Furthermore, since the quality of CVD single crystal diamond is equal to or higher than natural or synthetic High Pressure, High Temperature (HPHT) diamond, the resulting article will be of high quality, have less breakage, higher optical transmission and so forth. The present invention therefore includes the use of CVD monocrystalline diamond plates, as described herein, for gemstones, scalpels, wire dies, microtomes, heat spreaders, optical windows, knives, cutting tools, and substrates for monocrystalline diamond active devices, including semiconductor optical and electromechanical devices.

In a particularly preferred embodiment, the method can be used to provide diamond layers with a boron concentration ranging from about 0.005 parts per million (ppma) or lower to about 10,000 ppma or higher, and preferably between about 0.05 parts ppma to about 3000 ppma. Such layers can be grown using the CVD technique by incorporating boron in the precursor gas at concentrations ranging from about 100 ppma or lower to about 300,000 ppma or higher, and from about 1000 ppma to about 100,000 ppma, respectively (with respect to the carbon in the gas phase). The exact doping concentration will depend on the requirements of the intended device; the exact concentration in the gas phase will depend on the desired doping level in the film and on the level of residual impurities in the gas (N, P, Si) which could result in donor concentrations high enough to compensate boron and render all or a part of electrically inactive.

Diamond layers with one dopant (such as boron) can be latticed matched to layers containing other dopants (such as nitrogen) to yield unstrained doped layers. This can be accomplished by incorporating the appropriate relative impurity concentrations, as given by the previously described equations which relate the impurity concentrations with the resultant lattice constant change. Doping with zero strain (strain balanced by isotope tailoring) can be expected to result in the following benefits: (1) reduced crystal defects due to strain, (2) enhanced device performance (carrier transport and lifetime), and (3) higher doping levels, however achievable dopant concentrations with strain are limited due to energetic barriers created by strain energy.

In addition, diamond layers with tailored strain can be created by growing layers with selected impurity levels which create the desired lattice mismatch. Such a structure can consist of undoped layers and or layers containing boron, nitrogen, phosphorus, sulfur, lithium and/or isotopic enhancement. Addition of controlled or tailored strain will enable better performance of existing diamond devices as well as design and fabrication of new devices. The better performance is due to the ability to (1) tailor electrical bandgap (shifts due to strain allow for realization of modified bandgap energies and/or bandgap alignments which will enable better device performance as well as new device designs), (2) tailor refractive index (refractive index is known to change with applied pressure (see M. A. Prelas et al., *Handbook of Industrial Diamond and Diamond Films*, Marcel Dekker, Inc., p. 231 (1998)), which enables fabrication of novel waveguide structures and other optical optoelectronic devices), and tailor mechanical properties (hardened layers and strain and crack blocking layers).

Whole diamonds or individual layers can be made to have a blue coloration which ranges from sky blue to very dark blue by adding boron to the precursor gas to yield boron concentrations ranging from about 0.05 ppma to about 3000 ppma in the diamond, respectively. In such films, the optical absorption coefficient for wavelengths from 450 nm to 7 $\mu$m will increase as the doping level is increased and as the thickness is increased.

Single diamonds or individual layers can be made with room temperature electrical resistivity ranging from about 100,000 $\Omega$-cm to about 0.0005 $\Omega$-cm, and preferably from about 5000 $\Omega$-cm to about 0.02 $\Omega$-cm, by adding boron to the precursor gas to yield boron concentrations ranging from about 0.005 ppma to about 10,000 ppma (and preferably from about 0.01 ppma to about 3000 ppma) in the diamond.

Such boron doped layers can also be grown in conjunction with isotopically enriched layers in order to create layer junctions which have band gap discontinuities. For example, a boron-doped $^{13}C$ enriched layer on a natural isotope undoped layer creates a doped layer with a wider band gap than the undoped layer. Such a layer can be expected to yield enhanced electrical properties relative to a structure with no band gap discontinuity.

Making diamond with controlled strain allows fabrication of structures with tailored electrical and optical properties enabling new types of devices. For example, it is known that semiconductors (including diamond) undergo a change in band gap energy and structure when the material is placed in tension or compression. Theoretical studies of changes in diamonds band gap due to strain have been performed (see W. E. Pickett et al., "Effects of strain on the band structure of diamond", *Micro-Optoelectronic Materials*, SPIE vol. 877, Ed. C. Kukkonen (1988) and W. R. L. Lambrecht et al., "Electronic structure and total energy of diamond/BeO interfaces", vol. 7, J. Mater. Res., p. 696 (1992)) and they indicate that substantial band energy and structure changes can be expected for the levels of strain which can be attained using the approach given in this patent. The bandgap energy change associated with hydrostatic pressure change is provided using the following equation:

$$dE/dP = 6 meV/GPa, \quad (IX)$$

where dE/dP=band gap energy change divided by pressure change, and meV and GPa are the respective energy and pressure units (see M. A. Prelas et al., *Handbook of Industrial Diamond and Diamond Films*, Marcel Dekker, Inc., p. 4 (1998)).

A film which is strained due to a lattice mismatch with respect to a host substrate will result in a biaxial strain. As an example, the strain associated with growing an (undoped) 100% $^{13}C$ film on a natural isotope (undoped) substrate could be expected to increase the band gap energy by several meV. The increase in gap energy associated with the strain will allow the creation of a band gap discontinuity at the strained/unstrained interface, and this discontinuity can be employed to make numerous novel devices, following the approaches used in heterojunction devices such as in the III-V semiconductor device family, as well as the recent examples of device applications using Si—SiGe alloy structures. In addition, enhancements in diamond device structures can be expected, for example in the delta doped diamond structure, which utilizes carrier transport at the doped/undoped interface as the active device region. Incorporation of a band offset through use of controlled strain can be used to enhance the carrier diffusion into the active region.

Another use of strain which has been discussed for the Si/SiGe system is for making devices applicable to quantum computing (see R. W. Keyes, "Strained silicon for quantum computing", *J. Phys. D: Appl. Phys.*, vol. 35, pp. L7-L10 (2002)). In the Si/SiGe system, the approach is to grow strained Si on SiGe in a manner which will modify the wavefunction of impurity atoms, preferentially populating one electron energy state of the impurity. The end result of the strain induced change is to make the electron-nuclear interaction more uniform, and this enables the use of the impurity atom as a quantum bit in a manner which is far more predictable than that achieved when no controlled strain is applied. Use of controlled strain in diamond enables similar applications.

Another example of the use of controlled strain in diamond is the ability to change the refractive index. Diamonds refractive index (similar to other semiconductor materials) is known to change when the material is subjected to compressive stress. The change in refractive index is provided using the following equation:

$$(1/n)dn/dP = -0.36 * 10^{-12} Pa^{-1}, \quad (X)$$

where n=refractive index, dn/dP=index change divided by pressure change, and $Pa^{-1}$ are the pressure units (see M. A. Prelas et al., *Handbook of Industrial Diamond and Diamond Films*, Marcel Dekker, Inc., p. 231(1998)). Controlled strain will enable controlled index changes. By sequencing such layers in a manner which creates step changes in the refractive index, numerous optical devices can be realized including waveguides and gratings.

In another embodiment of the current invention the inventors have discovered that the normal isotope single crystal diamonds, which are grown by the CVD process described herein, have a thermal conductivity substantially in excess of 2200 W/mK at room temperature. Measurements of thermal conductivity were made by the application of a heat source to one side of the diamond sample and measuring the temperature on the opposite side of the sample. The equipment was calibrated by measuring aluminum, copper, and nitrogen doped diamond and found to give a thermal conductivity of 3200 W/mK at room temperature. This is the highest thermal conductivity for a natural isotope abundance diamond (single crystal or polycrystal) ever produced by any technique. This high thermal conductivity is entirely unexpected from the prior art since all previous natural and synthetic diamonds having the natural isotope distribution have a thermal conductivity no higher than 2500 W/mK.

The single crystal diamond produced herein has been tested as wire dies and has resulted in a larger yield of high quality wire than dies made with natural or synthetic HPHT diamond crystals. These results confirm that the articles of this invention will give increased performance through higher tool life.

Engineering calculations of the requirements for a heat spreader for a high power laser or microwave device show that the cooling effect is directly related to the thermal conductivity of the diamond, the thickness of the diamond and the diameter. This indicates that it is possible to increase the performance of a heat spreader by increasing the thermal conductivity of the diamond or to reduce the cost by using less diamond. Furthermore, the attributes which one might expect in an exceptionally high thermal conductivity diamond are exhibited in this material, including (1) high laser damage threshold, (2) enhanced wire die life. Therefore it appears that the single crystal diamonds of this invention will have the performance of the isotopically enriched diamonds but without the high cost of isotope enrichment (the cost of the carbon precursors in the present process is virtually negligible).

Single crystal synthetic diamond has been grown by the HPHT method (U.S. Pat. No. 5,127,983) and found to exhibit a maximum thermal conductivity of 2200–2500 W/mK at room temperature. HPHT diamond has been grown as free standing crystals in sizes of several millimeters on an edge. These large crystals are readily fabricated by polishing into slabs by which accurate measurements of thermal conductivity can be made. Single crystal diamond is produced by the CVD method by growth on a single crystal seed which can originate from a natural diamond crystal, a high pressure grown diamond crystal or a CVD grown diamond crystal. Growth of diamond on single crystal diamond seeds has been demonstrated from methane or other hydrocarbon precursors using hot filament, microwave plasma, DC plasma and combustion flame at temperatures ranging from 800 to 1500 degrees Celsius (U.S. Pat. Nos. 5,628,824, 5,387,310, 5,470,21, 5,653,952). There are no reports of measurements of thermal conductivity on these crystals in part because the above cited processes leave the CVD diamond crystal attached to the diamond seed crystal and in part because the diamond crystals even if removed from the seed crystal would be too thin to make a meaningful measurement of the thermal conductivity.

A CVD crystal can be removed from its seed crystal by a number of means. The seed crystal can be removed by grinding away the seed crystal with diamond grit in a manner which is well known in the art. Alternatively the seed crystal can be removed by sawing with a diamond impregnated diamond wheel as commonly used to cut industrial and gem diamonds (see J. E. Field et al., *The Properties of Natural and Synthetic Diamond*, Academic Press (1992)). In still another method for removing the CVD diamond from the seed crystal a sacrificial layer is produced on the diamond seed surface, the CVD diamond is grown on top of this sacrificial layer and the sacrificial layer is subsequently removed to yield a free standing diamond crystal plate. Methods for producing such a sacrificial layer and removal thereof are: ion implantation to form non-diamond layer beneath the seed surface followed by a oxidative removal process consisting of electrolysis or heating in an oxidizing atmosphere (U.S. Pat. No. 5,587,210), building a porous structure through which diamond can grow and which said porous structure can be removed by a combination of acid leaching and oxidation (U.S. Pat. Nos. 5,443,032 and 5,614,019); or depositing a layer of non diamond material which can be removed by oxidation or other treatment (U.S. Pat. No. 5,290,392).

In all of these cases, claims have been made and granted for growing and removing thick single crystal diamond from natural and high pressure diamond seed crystals. However none of these processes have actually previously been reduced to practice and produced thick crystals of high enough quality for thermal conductivity, impurity measurements or to fabricate tools, wire dies, windows or heat spreaders. In actual fact, the growth rates described in the above process patents are so slow as to be economically not viable and would take hundreds of hours to produce a CVD diamond crystal of any commercial utility.

In the present invention, high thermal conductivity single crystal diamond is obtained by growing in the following manner: (1) a diamond crystal, at least about 20 micrometers, preferably 50 micrometers, and more preferably, at least about 75 or even 100 micrometers thick, is grown on single crystal seed which can be chosen from natural diamond crystals, synthetic high pressure diamond crystals or synthetic CVD diamond crystals; (2) the diamond crystal is grown from hydrocarbon gases and hydrogen and can contain or not contain oxygen and is rich in atomic hydrogen; (3) the CVD growth is carried out at growth rates in excess of 10 micrometers per hour, and the CVD grown crystal is removed from the seed crystal by grinding, sawing, use of a sacrificial layer or other removal method as might be found useful; and (4) the nitrogen content of the starting gas composition is low enough as to result in a final CVD diamond crystal which has less than 10 to 20 ppm nitrogen incorporated into the crystal into substitutional sites and/or into interstitial sites. When these conditions are met, then the single crystal diamond produced will have a thermal conductivity of greater than 2200 W/mK and the material will be of the size and quality required for use as tools, wire dies, optical windows, and heat spreaders.

As already discussed, the high demand for synthetic CVD diamonds is explained by its wide application to almost a limitless number of applications. Some of the applications have been considered already, i.e., electrical, optical, and industrial, however, there is additional application in regards to optics and electronics that still need to be discussed. In addition, applications involving optoelectrical devices, as well as the areas of detectors and electrodes, are also important to consider herein.

Optical applications involving CVD diamond can include (1) fabricating windows for lasers and spectrometers, anvils for high pressure research and quality control, optical waveguides, wide wavelength range windows for control and detection systems (fire, missile defense, ozone hole mapping, etc) and (2) producing gemstones. CVD diamond can be grown such that it is chemically inert, strong, and transparent from the UV to the far IR spectrum, which makes it well suited for use as a protective optic coating or an IR window. With these properties, CVD diamond has potential to be used in the gemstone industry as well. In the past, an obstacle to a CVD diamond being perfectly suited for these applications was the fact that a CVD diamond's surface was generally rough. This roughness, in turn, caused attenuation and a scattering of transmitted signals. Thus, the surface needed to be polished smooth, or the diamonds needed to be grown with a smooth surface. See W. May, "CVD Diamond—a New Technology for the Future", *Endeavor Magazine*, 19(3), p 105 (1993). While polishing the diamond is a less efficient method because of the waste of material being ground off, one can now grow the diamond with a smooth surface fairly easily. This can be accomplished by doping and varying the isotope concentration of the grown diamond to eliminate any lattice mismatch and lattice strain in the diamond layer.

As previously discussed, a method of doping with boron (or other lattice expanding impurities) can be used to prepare low-dislocation (or dislocation-free) diamond crystals, substrates, or structures. However, doping does tend to promote lattice strain in the diamond layer being formed, which degrades the performance of optical properties of the layer. By varying $^{12}C/^{13}C$ isotope concentrations to match the doped layers accordingly, a dislocation-free and unstrained diamond lattice can be grown. Likewise, the $^{12}C/^{13}C$ isotope concentrations of a doped layer can be varied to match the lattice structure of an undoped layer to create a dislocation-free and unstrained diamond lattice structure.

In addition, as previously mentioned, this method could be expanded with the incorporation of other elements in the grown diamond. One such element would be neodymium (Nd) which is the most effective solid state laser material. With its incorporation, lasers could be developed that have much higher power potential. Future applications for such a Nd laser would likely include welding, cutting, laser weaponry, LIDAR visible and UV laser pump sources, medical diagnostics and military target designation. Following a procedure similar to the one for doping, in incorporating other elements in layers of the diamond lattice structure, one would again be able to create an unstrained structure by varying the $^{12}C/^{13}C$ isotope concentration of the doped layers to be lattice matched to pure diamond layers.

Electrical applications involving CVD diamond can include fabricating a wide variety of semi-conducting devices, such as Field Effect Transistors (FETs), High-voltage (HV) switches, and p-n junctions. For active electronic devices, it is desirable to have (I) insulating regions, (ii) p and/or n-type semi-conducting material, and (3) electrical contacts. Undoped CVD diamond forms a good insulator because of its high resistivity. As previously mentioned, in order for CVD diamond to be an effective semiconductor device, it needs to be doped, thus altering its use as an insulator to one as a semiconductor. Doped with even small amounts of impurities, CVD diamonds can have their electrical properties altered, and because of its large bandgap (5.5 eV), it can still retain its semi-conducting properties up to temperatures of 1300 K.

One problem that has been documented in using CVD diamond is that it is normally comprised of polycrystalline diamond. Because of this, one could normally expect grain boundaries and other defects which reduce the lifetime and mobility of carriers. See id. at 105. However, as previously mentioned, applicant has produced CVD diamond made of single crystal boron doped diamond, which has significantly higher mobility than polycrystalline diamond of the same doping level.

In creating semi-conducting devices, p and/or n-type layers can be created with respective doping of boron and phosphorous (or nitrogen, sulfur, or lithium). A p-type semi-conducting layer can be generally provided with a high ion implantation of boron. In addition, the isotope concentrations of $^{12}C/^{13}C$ can be again varied in each layer to exactly match the lattice spacing of an pure diamond substrate and, in turn, provide structures which have the heavy boron concentration required for device performance, as in III-V semiconductor devices, but have no strain.

On the other hand, the creation of n-type semi-conducting layers has been a bit more difficult to provide consistently. As previously discussed, the two main doping elements, phosphorous and sulfur, are much larger than boron, which limits the quantity that can actually be doped, and in turn, their potential electrical effect on the device. However, as previously discussed, when mixed with appropriate isotope concentrations of $^{12}C/^{13}C$, heavier concentrations of the phosphorous or sulfur can be utilized to create a more desirable semi-conducting device and still limit or even eliminate lattice mismatching. Utilizing a more heavily doped $^{13}C$ film, it will be possible to diffuse carriers into a very pure normal diamond and obtain high carrier concentrations of holes and electrons which also have high mobility. Such structures will enable the design and fabrication of high performance semiconductor devices.

Optoelectronics applications involving CVD diamond can include the fabrication of LEDs. In an LED, when electrons from the n-type region recombine with holes in the p-type region, they release energy, which takes the form of both heat and light in LEDs. The wavelength of the light is determined by the band-gap of the emitting material. Effective radiative recombination (i.e., emitting light) requires that the ground and excited electronic states be lying within the band gap. The wide band-gap of diamond (5.5 eV) is most attractive in its use in LEDs and semiconductor laser applications since it affords much lower wavelengths (i.e., ultra-violet, blue, green) of light to be emitted. See M. A. Prelas et al., *Handbook of Industrial Diamond and Diamond Films*, Marcel Dekker, Inc., p. 228 (1998). Herein also, the isotope concentrations of $^{12}C/^{13}C$ can again be varied in each layer to create a unstrained, lattice matched semiconductor device.

While it is effective to have a large band-gap, a CVD diamond can also be grown to have a smaller band-gap as well by adjusting the isotope concentrations of $^{12}C/^{13}C$. As previously stated, $^{12}C$ and $^{13}C$ isotopes have different masses, and thus, a change in regards to their concentration in the CVD diamond has an influence on the band-gap, as well as the electrical properties of the device.

Detector applications involving CVD diamond can include those concerning both radiation and UV. For instance, to utilize CVD diamond as a radiation detector, a diamond film is typically configured in a metal-insulator-metal (MIM) configuration, and is utilized to produce ion beam induced current (IBIC) signals. The diamond film is connected to an external amplifier circuit, which provides a bias voltage to activate the detector. Charge is then subsequently generated in the external circuit "by induction due to the movement of the electron-hole pairs under the influence of the electric field" (see David N. Jamieson, "Recent Applications of Nuclear Microprobe Analysis to Frontier Materials", *Fifth International Conference on Nuclear Microprobe Technology and Applications*, Santa Fe, N. Mex., p. 3, November 1996). When the diamond is subjected to radiation beams, "the photons activate the impurities in the CVD diamond, causing a local conductivity change and then a local current change between the contact points" (see Deming Shu et al., "CVD Diamond-Based Position Photoconductive Detector for High-Flux X-Rays", *Advanced Photon Source*, p. 1, (1999). The amount of current generated "is a function of the photon flux", which is a derivative of the radiation beam. See id.

One problem with this application often results from defects in the diamond. These defects can rapidly trap charge and allow it to recombine earlier, thus reducing the charge otherwise available in the external circuit. For example, the center of the diamond grains are about three times more efficient at charge collection than the grain boundaries (see David N. Jamieson, "Recent Applications of Nuclear Microprobe Analysis to Frontier Materials", *Fifth International Conference on Nuclear Microprobe Technology and Applications*, Santa Fe, NM, p. 3, November 1996). A significant improvement in this type of detector can be made by the application of very low resistivity semiconductor contact layers followed by an ohmic contact to the contact layer. The limits of doping and the strain associated with such a heavily doped contact layer have made their use limited. By selecting appropriate $^{13}C/^{12}C$ concentrations in forming the doped diamond, the layer could be lattice matched to the contact layer to eliminate or reduce the lattice strain. In turn, improved contact performance could be achieved which would result in improved device performance. The same improvement in contact performance can be applied to any diamond semiconductor device design which utilizes heavily doped n or p layers for contact to the semiconductor device.

Pollution of the environment and water contamination are two major global problems. Diamond electrodes have started to be used to clean sewage and water, and create chlorine by oxidizing organic pollutants. Generally, diamond electrode coatings have been deposited on steel sheets by large area hot-filament CVD, and doped with boron concentrations. However, up to this point, these electrodes have been largely limited to polycrystalline CVD diamond.

As previously disclosed, boron doped diamond is highly resistant in acidic or basic aqueous solutions. Also, while polycrystalline diamond electrodes have a lifetime that is many times that of conventional electrode materials such as graphite or stainless steel, polycrystalline diamond undergoes catastrophic failure at many hours of operation because of the accumulation of impurities at its grain boundaries.

As already taught, applicant has produced electrodes made of single crystal, boron doped CVD diamond. These electrodes have no grain boundaries and have lifetimes which are significantly longer than polycrystalline diamond and show uniform wear, but no catastrophic failure.

Moreover, mono crystalline diamond electrodes can withstand several orders of magnitude higher current than polycrystalline diamond can without catastrophic failure or measurable erosion. With this larger current density, the diamond does not have to be sized as large or doped as heavily. In addition, by varying the isotope concentrations of $^{12}C/^{13}C$ in the doped layers, the lattice structure can be made strain free, enhancing device performance even more.

Test Methods

The various parameters set forth in the present application can be determined in any suitable fashion. For purposes of the present claims these parameters are determined by the methods set forth below.

Thermal Conductivity

Methods to measure diamonds thermal conductivity have been reviewed in the literature (see M. A. Prelas et al., "Thermal Measurement Techniques", *Handbook of Industrial Diamond and Diamond Films*, Marcel Dekker, Inc., pp. 193–226 (1998)). The measurement techniques include the use of steady state heating wherein heat is applied to one part of the sample, and the temperature distribution on the rest of the sample is measured. If the test geometry is linear, the thermal conductivity (k) can be deduced from the equation:

$$k = \text{Heating Power}/\sigma^* \Delta T/\Delta x \qquad (XI)$$

where k=thermal conductivity, Heating Power=the power applied to heat the diamond, σ=the cross sectional area, and ΔT/Δx=the measured thermal gradient along the sample.

Care must be taken to account for other heat loss mechanisms, including radiation and alternate conduction paths. The thermal conductivity of diamond can also be measured using periodic heating to generate thermal waves, and the thermal diffusivity is measured. A periodic heat source is applied to the sample via pulsed heating of a direct contact heater or by pulsed operation of a light source (such as a laser) which heats a region of the sample. The thermal wave diffusion is measured using thermocouples or infrared temperature sensors, and this allows determination of the thermal diffusivity. The diffusivity (D) is related to the thermal conductivity (k) through the equation:

$$k = D^* c \qquad (XII)$$

where k=thermal conductivity, and c=heat capacity/unit volume.

Nitrogen Content

There are a number of methods used to measure the nitrogen content in diamond, with the most appropriate technique being determined by the type of nitrogen center found in the diamond being measured. Nitrogen can be present in a number of configurations in diamond, and the most common configurations are: single substitutional form (ssf); a isolated nitrogen atom replaces one carbon atom in the lattice, the A-center; a pair of adjacent substitutional nitrogen atoms, and the B-center; attributed to four substitutional nitrogen atoms clustered around a lattice vacancy (see C. D. Clark et al., "Absorption and Luminescence Spectroscopy", *The Properties of Natural and Synthetic Diamond*, J. E. Field, Academic Press (1992)). The nitrogen content in diamond can be determined using mass spectroscopy, optical absorption, and electron spin resonance (esr). Mass spectroscopy (such as secondary ion mass spectroscopy (SIMS)) is particularly preferred since it can be used to detect all forms of nitrogen in diamond, however it consumes some or all of the sample. The spectroscopic measurement techniques are non-destructive, but they are sensitive to only certain forms of nitrogen in diamond. Infrared absorption can be used to determine the nitrogen concentration of various forms of nitrogen using the following calibration factors:

ssf: concentration=22 at. ppm/1 $cm^{-1}$ absorption at 1130 $cm^{-1}$

A center concentration=17.5 at. ppm/1 $cm^{-1}$ absorption at 1130 $cm^{-1}$

B center concentration=103.8 at. ppm/1 $cm^{-1}$ absorption at 1130 $cm^{-1}$

The ssf form (which is paramagnetic) can also be measured using esr by comparing the microwave absorption to the absorption of a standard with known spin concentration. For CVD and HPHT grown diamond, nitrogen has been found to incorporate almost exclusively n the ssf and so the nitrogen concentration is determined using either the infrared absorption (with the ssf calibration factor), esr, and/or mass spectroscopy.

Boron Content

The boron content in diamond can also be determined using mass spectroscopy, and using optical absorption, as well as through electrical measurements. The absorption at 3563 nm gives the concentration of uncompensated boron through the equation:

$$[N_a - N_d](cm^{-3}) = 0.54 \times 10^{14} = abs.(1\ cm^{-1}) @ 3563\ nm \qquad (XIII)$$

where $N_a$=total boron concentration, and $N_d$=nitrogen concentration in single substitutional form (which can be determined using one of the techniques given above). Boron concentration can also be determined by analyzing the electrical carrier concentration as a function of temperature using well established equations of electrical neutrality (see J. S. Blakemore, *Semiconductor Statistics*, Dover Publications (1987)).

Isotope Content

The isotope content of diamond can be determined using mass spectroscopy, x-ray diffraction, and Raman spectroscopy. The most accurate way to determine the isotopic content of a diamond is by using mass spectrometry techniques such as SIMS or analysis of the combustion products made by burning the diamond. Such techniques allow determination of the isotope content with a demonstrated resolution on the level of 0.01% (see T. R. Anthony, et. al., "Thermal diffusivity of isotopically enriched $^{12}C$ diamond" Physical Review B42, p. 1105 (1990).), while SIMS measurements are known to be capable of parts per billion resolution if appropriate measurement techniques are used and standard samples are available (see J. M. Anthony, "Ion Beam Characterization of Semiconductors", *Semiconductor Characterization; Present Status and Future Needs*, W. M. Bullis, D. G. Seiler, and A. C. Diebold, AIP Press (1996)). However, it must be recognized that mass spectroscopy techniques require destruction of some or all of the diamond during the measurement.

Both x-ray diffraction and Raman spectroscopy (discussed below) can be used to measure the isotope content in diamond in a non-destructive manner, but the accuracy of the measurement will be governed by the equipment used and the diamond quality. High resolution x-ray diffraction can be used to measure the lattice constant, and the measured lattice constant can be used to determine the isotope content of the diamond using the equation given previously. Note that in order to determine the isotope content at atomic percent levels using x-ray analysis, the lattice constant must be determined with a resolution of 0.00005 angstroms. This requires use of high resolution x-ray diffraction equipment such as a double crystal diffractometer with a highly perfect monochrometer crystal and including sample rotation. Such a measurement approach has been described by Bartels (see W. J. Bartels, *Journal of Vacuum Science and Technology*, B1, p. 338 (1983)).

To measure isotope contents with a resolution less than 1% requires further increases in measurement accuracy. The isotope content can also be determined by measuring peak position of the first order one-phonon Raman band, with the isotopic dependence described by K. C. Hass, et. al. (see K. C. Hass, et. al., "Lattice dynamics and Raman spectra of isotopically mixed diamond", Physical Review B45, pp. 7171–7182 (1992).). Note that the position of the Raman band shifts from 1332 cm to 1281 cm$^{-1}$ for a isotope change from 100% $^{12}$C to 100% $^{13}$C, with the position change being almost linear with isotope content. Thus, in order to use Raman spectroscopy to measure 1% changes in isotope content, the Raman line position must be measured with a certainty which is <0.5 cm$^{-1}$. This requires that measurements be performed using a high resolution Raman spectrometer, and requires that the diamond quality to be high enough to yield Raman line widths which are <0.5 cm$^{-1}$. To measure isotope contents with a resolution less than 1% requires further increases in measurement accuracy.

EXAMPLES

Selection of the appropriate technique to use to determine the isotope content of a particular diamond will depend on the required accuracy and the availability of a consumable sample, as is discussed above. The following non-limiting examples are provided in Table 6 below to illustrate the present invention. In other words, while the examples are provided to demonstrate the invention, they are not provided to limit the invention only as such.

Examples 1–25 illustrate the use of the present invention using various types of CVD diamond growth techniques including: hot filament, microwave plasma, DC plasma, rf plasma, arc jet and flame. Examples 1, 3, 5, 11, 12, 13, 14, 16, 17, 18, 19, and 20 illustrate the growth of undoped $^{12}$C diamond single crystal on natural, HPHT synthetic diamond and CVD synthetic diamond substrates. Examples 2 and 5 illustrate growth of undoped $^{13}$C single crystal diamond layers. Examples 4, 8, 10, 24, and 25 illustrate single and multiple boron doped layers on $^{12}$C diamond substrates. Example 9 illustrates the growth of multiple layers alternating between boron doped and undoped diamond, all of which are on a $^{12}$C diamond substrate. Example 24 illustrates a boron doped layer on $^{12}$C diamond which is grown to a thickness less than the critical thickness, while example 25 illustrates the same structure grown to a thickness greater than the critical thickness. Examples 6, 7, 15, 21, 2, and 23 illustrate the growth of boron doped, phosphorous doped, sulfur doped and nitrogen doped $^{13}$C diamond layers on $^{12}$C diamond substrates.

It will be appreciated by those familiar in the art of growing diamond, that the incorporation of impurities into diamond from the gas phase (referred to as the distribution coefficient) is an inexact science in that the exact distribution coefficient is dependent on crystal orientation, concentration in the gas, temperature, pressure, other impurities present and other factors. Thus, when dopants are grown into or onto a diamond structure, the concentration at which the dopant is added to the process is often greater than the concentration that actually ends up being utilized. In addition, the gas compositions in the examples are by the way of illustration only and intended to be broad examples and not precise, lower or higher actual dopant concentrations may actually required in order to achieve lattice matching.

TABLE 6

| # | Orient | Source | Isotope | Dopant | Ppm Dopant | P | T | Rate | Time (hr) | Substr | Exi |
|---|---|---|---|---|---|---|---|---|---|---|---|
| 1 | 100 | Methane | $^{12}$C | 0 | 0 | 40 | 950 | 1 | 24 | Ia-N | HF |
| 2 | 100 | Methane | $^{13}$C | 0 | 0 | 40 | 950 | 1 | 24 | IIa-N | HF |
| 3 | 100 | Acetone | $^{12}$C | 0 | 0 | 40 | 1000 | 1 | 48 | Ib-HP | HF |
| 4 | 100 | Acetone | $^{12}$C | B(MetBor) | 1000 | 40 | 1000 | 1 | 0.2 | Ib-HP | HF |
| 5 | 100 | Methane | $^{13}$C | 0 | 0 | 40 | 950 | 1 | 24 | CVD | HF |
| 6 | 100 | Methane | $^{13}$C | B(diborane) | 100 | 40 | 950 | 1 | 0.17 | CVD | HF |
| 7 | 100 | Methane | $^{13}$C | P(PH3) | 100 | 40 | 950 | 1 | 0.17 | CVD | HF |
| 8a | 100 | Methane | $^{12}$C | B(diborane) | 1000 | 40 | 950 | 1 | 0.25 | CVD | HF |
| 8b | 100 | Methane | $^{12}$C | 0 | 0 | 40 | 950 | 1 | 75 | BCVD | HF |
| 9a | 100 | Methane | $^{12}$C | B(diborane) | 1000 | 40 | 950 | 1 | 0.02 | CVD | HF |
| 9b | | | | 0 | 0 | | | | .02 | BCVD | |
| 9c | | | | B(diborane) | 1000 | | | | .02 | CVD | |
| Ten | | | | 0 | 0 | | | | .02 | BCVD | |
| layer | | | | etc | etc | | | | etc | Etc | |
| 10 | 100 | Methane | $^{12}$C | B(diborane) | 1000 | 40 | 900 | 1 | 250 | CVD | MW |
| 11 | 100 | Methane | $^{12}$C | 0 | 0 | 100 | 900 | 10 | 25 | CVD | AJet |
| 12 | 100 | Acet-O | $^{12}$C | 0 | 0 | 769 | 1000 | 20 | 25 | CVD | CBS |
| 13 | 110 | Methane | $^{12}$C | 0 | 0 | 40 | 950 | 1 | 24 | Ia-N | HF |
| 14 | 111 | Methane | $^{12}$C | 0 | 0 | 40 | 950 | 1 | 24 | Ia-N | HF |
| 15 | 100 | Methane | $^{13}$C | B-metal | Pwdr | 40 | 950 | 1 | | IIa-N | HF |
| 16 | 100 | Methane | $^{12}$C | 0 | 0 | 100 | 950 | 5 | 200 | CVD | MW |
| 17 | 100 | Methane | $^{12}$C | N | 100 | 150 | 1200 | 30 | 20 | Ib-HP | MW |
| 18 | 100 | Methane | $^{12}$C | 0 | 100 | 100 | 950 | 5 | 20 | Ib-HP | DC |
| 19 | 100 | Methane | $^{12}$C | 0 | 100 | 150 | 950 | 5 | 20 | Ib-HP | DC |
| 20 | 100 | Methane | $^{12}$C | 0 | 100 | 100 | 950 | 5 | 20 | Ib-HP | RF |
| 21 | 100 | Methane | $^{13}$C | P(OH3) | | 40 | 950 | 1 | 0.12 | CVD | HF |
| 22 | 100 | Methane | $^{13}$C | S(H2S) | | 40 | 950 | 1 | 0.12 | CVD | HF |
| 23 | 100 | Methane | $^{13}$C | N(N2) | | 40 | 950 | 1 | 0.12 | CVD | HF |

TABLE 6-continued

| # | Orient | Source | Isotope | Dopant | Ppm Dopant | P | T | Rate | Time (hr) | Substr | Exi |
|---|--------|--------|---------|--------|------------|---|---|------|-----------|--------|-----|
| 24 | 100 | Methane | $^{12}$C | B(diborane) | 1000 | 40 | 900 | .5 | .5 | CVD | MW |
| 25 | 100 | Methane | $^{12}$C | B(diborane) | 1000 | 40 | 900 | 25 | 25 | CVD | MW |

Example 1

Growth of (100) Oriented Single Crystal Diamond on Type IA Natural Diamond Using the Hot Filament Method A natural type IA diamond single crystal is sliced on a diamond impregnated saw to yield a substrate of (100) orientation. The substrate is polished with diamond grit suspended in olive oil and impregnated into a cast iron plate to achieve a surface which is free of grooves, scratches or digs. This substrate is then cleaned with hot detergent in an ultrasonic cleaner, rinsed in acetone and dried. Following cleaning the substrate is placed in a hot filament chemical vapor deposition reactor (HFCVD) having a substrate heater consisting of a tungsten filament held within a molybdenum holder and having a rhenium filament approximately 10 mm from the substrate. The reactor is evacuated to a pressure of less than 10 millitorr and then backfilled to a pressure of 40 torr with hydrogen having a purity of 99.999% and at a rate of 100 sccm.

Power is applied to the rhenium filament to achieve a temperature of 2100° C., whereupon power is applied to the substrate heater until the substrate reaches a temperature of 950° C. as measured by a disappearing filament optical pyrometer. After stabilizing the temperature of the filament and substrate for five minutes methane gas is added to the gas stream so that the final mixture is 99% hydrogen and 1% methane while maintaining the total gas flow at 100 sccm. Part of the hydrogen is converted to atomic hydrogen on the surface of the filament and the methane decomposes in the presence of the atomic hydrogen on the substrate surface to form an epitaxial layer of diamond. Growth is maintained for 24 hours at a rate of 1 micrometer per hour to form a single crystal deposit of 24 micrometers thick. At the end of this time period the methane flow is terminated, the filament power and substrate power are terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving a single crystal diamond film attached to a single crystal seed.

An undoped single crystal diamond plate having a (100) orientation is obtained having a thickness of approximately 24 μm.

Example 2

Growth of (100) Oriented Single Crystal Diamond on Type IIA Natural Diamond Using the Hot Filament Method A natural type IIA diamond single crystal is sliced on a diamond impregnated saw to yield a substrate of (100) orientation. The substrate is polished with diamond grit suspended in olive oil and impregnated into a cast iron plate to achieve a surface which is flat and free of grooves, scratches or digs. The substrate is then cleaned with hot detergent in an ultrasonic cleaner, rinsed in acetone and dried. Following cleaning the substrate is placed in a hot filament chemical vapor deposition reactor (HFCVD) having a substrate heater consisting of a tungsten filament held within a molybdenum holder and having a rhenium filament approximately 10 mm from the substrate. The reactor is evacuated to a pressure of less than 10 millitorr and the backfilled to a pressure of 40 torr with hydrogen having a purity of 99.999% and at a rate of 100 sccm.

Power is applied to the rhenium filament to achieve a temperature of 2100° C. whereupon power is applied to the substrate heater until the substrate reaches a temperature of 950° C. as measured by a disappearing filament optical pyrometer. After stabilizing the temperature of the filament and substrate for five minutes methane gas which has been enriched with respect to $^{13}$C is added to the gas stream so that the final mixture is 99% hydrogen and 1% $^{13}$C methane while maintaining the total gas flow at 100 sccm. Part of the hydrogen is converted to atomic hydrogen on the surface of the filament and the methane decomposes in the presence of the atomic hydrogen on the substrate surface to form an epitaxial layer of diamond. Growth is maintained for 24 hours at a rate of 1 micrometer per hour to form a single crystal deposit of 24 micrometers thick. At the end of this time period the methane flow is terminated, the filament power and substrate power are terminated and the substrate with film is cooled to room temperature. At this point the reactor is evacuated to remove all hydrogen and then filled with room air to atmospheric pressure. The single crystal diamond substrate with the attached diamond film is removed and cleaned in a mixture of chromic acid and sulfuric acid at temperature of 250° C. to remove residual non diamond carbon from the diamond surface, leaving a single crystal diamond film attached to a single crystal seed.

An undoped single crystal diamond plate having a (100) orientation is obtained having a thickness of approximately 24 μm.

Example 3

Growth of (100) Oriented Single Crystal Diamond on Type IB High Pressure Synthetic Diamond Using the Hot Filament Method A high pressure synthetic type Ib diamond single crystal is ground and polished to yield a substrate with a (100) orientation. The substrate is then cleaned with hot detergent in an ultrasonic cleaner, rinsed in acetone and dried. Following cleaning the substrate is placed in a hot filament chemical vapor deposition reactor (HFCVD) having a substrate heater consisting of a tungsten filament held within a molybdenum holder and having a rhenium filament approximately 10 mm from the substrate. The reactor is evacuated to a pressure of less than 10 millitorr and then backfilled to a pressure of 40 torr with hydrogen having a purity of 99.999% and at a rate of 100 sccm.

Power is applied to the rhenium filament to achieve a temperature of 2100° C. whereupon power is applied to the substrate heater until the substrate reaches a temperature of 1000° C. as measured by a disappearing filament optical pyrometer. After stabilizing the temperature of the filament and substrate for five minutes acetone vapor is added to the gas stream so that the final mixture is 99% hydrogen and 1% acetone while maintaining the total gas flow at 100 sccm. Part of the hydrogen is converted to atomic hydrogen on the surface of the filament and the acetone decomposes in the presence of the atomic hydrogen on the substrate surface to form an epitaxial layer of diamond. Growth is maintained for 48 hours at a rate of 1 micrometer per hour to form a single crystal deposit of 48 micrometers thick. At the end of this time period the acetone flow is terminated, the filament power and substrate power are terminated and the substrate with film is cooled to room temperature. At this point, the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface. After cleaning the substrate and diamond are mounted in a saw having a copper blade impregnated with diamond grit, and sawing through the seed diamond to detach the single crystal diamond film from the single crystal seed.

An undoped single crystal diamond plate having a (100) orientation is obtained having a thickness of approximately 48 µm.

Example 4

Growth of (100) Oriented Boron Doped Single Crystal Diamond on Type IB High Pressure Synthetic Diamond Using the Hot Filament Method A high pressure synthetic type Ib diamond single crystal is ground and polished to yield a substrate with a (100) orientation. The substrate is then cleaned with hot detergent in an ultrasonic cleaner, rinsed in acetone and dried. Following cleaning the substrate is placed in a hot filament chemical vapor deposition reactor (HFCVD) having a substrate heater consisting of a tungsten filament held within a molybdenum holder and having a rhenium filament approximately 10 mm from the substrate. The reactor is evacuated to a pressure of less than 10 millitorr and then backfilled to a pressure of 40 torr with hydrogen having a purity of 99.999% and at a rate of 100 sccm.

Power is applied to the rhenium filament to achieve a temperature of 2100° C. whereupon power is applied to the substrate heater until the substrate reaches a temperature of 1000° C. as measured by a disappearing filament optical pyrometer. After stabilizing the temperature of the filament and substrate for five minutes acetone vapor is added to the gas stream so that the final mixture is 99% hydrogen and 1% acetone containing 1000 parts per million of methyl borate while maintaining the total gas flow at 100 sccm. Part of the hydrogen is converted to atomic hydrogen on the surface of the filament and the acetone decomposes in the presence of the atomic hydrogen on the substrate surface to form an epitaxial layer of diamond. Growth is maintained for 12 minutes at a rate of 1 micrometer per hour to form a boron doped single crystal deposit of 0.2 micrometers thick. At the end of this time period the acetone flow is terminated, the filament power and substrate power are terminated and the substrate with film is cooled to room temperature. At this point, the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface. After cleaning the substrate with the attached single crystal boron doped film diamond are mounted in a van der Pauw test system to measure the resistivity and mobility.

A boron doped single crystal film of diamond having a (100) is grown having a thickness of approximately 0.2 µm and is attached to a single crystal diamond substrate.

Example 5

Growth of (100) Oriented $^{13}$C Single Crystal Diamond on a CVD Grown Single Crystal Synthetic Diamond Using the Hot Filament Method A polished CVD grown diamond single crystal having a (100) orientation is cleaned with hot detergent in an ultrasonic cleaner, rinsed in acetone and dried. Following cleaning the substrate is placed in a hot filament chemical vapor deposition reactor (HCFVD) having a substrate heater consisting of a tungsten filament held within a molybdenum holder and having a rhenium filament approximately 10 mm from the substrate. The reactor is evacuated to a pressure of less than 10 millitorr and then backfilled to a pressure of 40 torr with hydrogen having a purity of 99.999% and at a rate of 100 sccm.

Power is applied to the rhenium filament to achieve a temperature of 2100° C. whereupon power is applied to the substrate heater until the substrate reaches a temperature of 950° C. as measured by a disappearing filament optical pyrometer. After stabilizing the temperature of the filament and substrate for five minutes methane gas which has been enriched with respect to $^{13}$C is added to the gas stream so that the final mixture is 99% hydrogen and 1% $^{13}$C methane while maintaining the total gas flow at 100 sccm. Part of the hydrogen is converted to atomic hydrogen on the surface of the filament and the methane decomposes in the presence of the atomic hydrogen on the substrate surface to form an epitaxial layer of diamond. Growth is maintained for 24 hours at a rate of 1 micrometer per hour to form a single crystal deposit of 24 micrometers thick. At the end of this time period the methane flow is terminated, the filament power and substrate power are terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving a single crystal $^{13}$C diamond film attached to normal isotope diamond seed.

An undoped $^{13}$C single crystal diamond plate having a (100) orientation is obtained having a thickness of approximately 24 µm.

Example 6

Growth of a (100) Oriented Boron and $^{13}$C Codoped Single Crystal Diamond Film on a CVD Grown Single Crystal Synthetic Diamond Using the Hot Filament Method A polished CVD grown diamond single crystal having a (100) orientation is cleaned with hot detergent in an ultrasonic cleaner, rinsed in acetone and dried. Following cleaning the substrate is placed in a hot filament chemical vapor deposition reactor (HCFVD) having a substrate heater consisting of a tungsten filament held within a molybdenum holder and having a rhenium filament approximately 10 mm from the substrate. The reactor is evacuated to a pressure of less than 10 millitorr and then backfilled to a pressure of 40 torr with hydrogen having a purity of 99.999% and at a rate of 100 seem.

Power is applied to the rhenium filament to achieve a temperature of 2100° C. whereupon power is applied to the substrate heater until the substrate reaches a temperature of 950° C. as measured by a disappearing filament optical pyrometer. After stabilizing the temperature of the filament and substrate for five minutes methane gas which has been enriched with respect to $^{13}$C and diborane is added to the gas stream so that the final mixture is 99% hydrogen and 1% $^{13}$C methane containing 100 ppm of diborane while maintaining the total gas flow at 100 seem. Part of the hydrogen is converted to atomic hydrogen on the surface of the filament and the methane decomposes in the presence of the atomic hydrogen on the substrate surface to form an epitaxial layer of diamond. Growth is maintained for 10 minutes at a rate of 1 micrometer per hour to form a single crystal deposit of 0.17 micrometers thick. At the end of this time period the methane flow is terminated, the filament power and substrate power are terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving a boron doped single crystal $^{13}$C diamond film attached to a normal isotope single crystal diamond seed.

A boron and $^{13}$C doped single crystal diamond film is grown (having reduced strain) attached to a CVD single crystal diamond substrate wherein the film has a (100) orientation and a thickness of approximately 0.17 µm.

Example 7

Growth of a (100) Oriented Phosphorous and $^{13}$C Codoped Single Crystal Diamond Film on a CVD Grown Single Crystal Synthetic Diamond Using the Hot Filament Method A polished CVD grown diamond single crystal having a (100) orientation is cleaned with hot detergent in an ultrasonic cleaner, rinsed in acetone and dried. Following cleaning the substrate is placed in a hot filament chemical vapor deposition reactor (HCFVD) having a substrate heater consisting of a tungsten filament held within a molybdenum holder and having a rhenium filament approximately 10 mm from the substrate. The reactor is evacuated to a pressure of less than 10 millitorr and then backfilled to a pressure of 40 torr with hydrogen having a purity of 99.999% and at a rate of 100 sccm.

Power is applied to the rhenium filament to achieve a temperature of 2100° C. whereupon power is applied to the substrate heater until the substrate reaches a temperature of 950° C. as measured by a disappearing filament optical pyrometer. After stabilizing the temperature of the filament and substrate for five minutes methane gas which has been enriched with respect to $^{13}$C and phosphene is added to the gas stream so that the final mixture is 99% hydrogen and 1% $^{13}$C methane containing 100 ppm of phosphene while maintaining the total gas flow at 100 sccm. Part of the hydrogen is converted to atomic hydrogen on the surface of the filament and the methane decomposes in the presence of the atomic hydrogen on the substrate surface to form an epitaxial layer of diamond. Growth is maintained for 10 minutes at a rate of 1 micrometer per hour to form a single crystal deposit of 0.17 micrometers thick. At the end of this time period the methane flow is terminated, the filament power and substrate power are terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving a phosphorous doped single crystal $^{13}$C diamond film attached to a normal isotope single crystal diamond seed.

A phosphorous and $^{13}$C co doped single crystal diamond film (having reduced stress) is formed on a CVD single crystal diamond substrate having a (100) orientation, wherein the film is also (100) orientation and has a thickness of approximately 0.17 µm.

Example 8

Growth of a Structure Having a Boron Doped Single Crystal Diamond Layer Followed by an Undoped Single Crystal Diamond Layer on a CVD Grown Single Crystal Synthetic Diamond Using the Hot Filament Method A polished CVD grown diamond single crystal having a (100) orientation and a thickness of 75 micrometers is cleaned with hot detergent in an ultrasonic cleaner, rinsed in acetone and dried. Following cleaning the substrate is placed in a hot filament chemical vapor deposition reactor (HCFVD) having a substrate heater consisting of a tungsten filament held within a molybdenum holder and having a rhenium filament approximately 10 mm from the substrate. The reactor is evacuated to a pressure of less than 10 millitorr and then backfilled to a pressure of 40 torr with hydrogen having a purity of 99.999% and at a rate of 100 sccm. Power is applied to the rhenium filament to achieve a temperature of 2100° C. whereupon power is applied to the substrate heater until the substrate reaches a temperature of 950° C. as measured by a disappearing filament optical pyrometer. After stabilizing the temperature of the filament and substrate for five minutes methane gas and diborane is added to the gas stream so that the final mixture is 99% hydrogen and 1% methane containing 1000 ppm of diborane while maintaining the total gas flow at 100 sccm. Part of the hydrogen is converted to atomic hydrogen on the surface of the filament and the methane decomposes in the presence of the atomic hydrogen on the substrate surface to form an epitaxial layer of diamond. Growth is maintained for 15 minutes at a rate of 1 micrometer per hour to form a single crystal deposit of 0.25 micrometers thick. At the end of this time, the diborane flow is terminated, and the methane flow continued for an additional 75 hours. At the end of this time period the methane flow is terminated, the filament power and substrate power are terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving a boron doped single crystal diamond layer imbedded in a 150 micrometer thick diamond crystal.

A (100) oriented single crystal diamond structure is formed having a 75 µm thick undoped CVD diamond followed by a 0.25 µm thick boron doped single crystal diamond layer, followed by a 75 µm thick CVD single crystal diamond layer.

Example 9

Growth of a Structure Having Alternating Layers of Boron Doped Single Crystal Diamond and Undoped Layers of Undoped Single Crystal Diamond Layer on a CVD Grown Single Crystal Synthetic Diamond Using the Hot Filament Method A polished CVD grown diamond single crystal having a (100) orientation and a thickness of 75 micrometers is cleaned with hot detergent in an ultrasonic cleaner, rinsed in acetone and dried. Following cleaning the substrate is placed in a hot filament chemical vapor deposition reactor (HCFVD) having a substrate heater consisting of a tungsten filament held within a molybdenum holder and having a rhenium filament approximately 10 mm from the substrate. The reactor is evacuated to a pressure of less than 10 millitorr and then backfilled to a pressure of 40 torr with hydrogen having a purity of 99.999% and at a rate of 100 sccm.

Power is applied to the rhenium filament to achieve a temperature of 2100° C. whereupon power is applied to the substrate heater until the substrate reaches a temperature of 950° C. as measured by a disappearing filament optical pyrometer. After stabilizing the temperature of the filament and substrate for five minutes methane gas and diborane is added to the gas stream so that the final mixture is 99% hydrogen and 1% methane containing 1000 ppm of diborane while maintaining the total gas flow at 100 sccm. Part of the hydrogen is converted to atomic hydrogen on the surface of the filament and the methane decomposes in the presence of the atomic hydrogen on the substrate surface to form an epitaxial layer of diamond. Growth is maintained for 1.2 minutes at a rate of 1 micrometer per hour to form a boron doped single crystal deposit of 0.02 micrometers thick. At the end of this time period the diborane flow is terminated, and the methane flow continued for an additional 1.2 minutes to produce an undoped layer of 0.02 micrometers thick. This cycle is repeated for one to ten times or more to produce a single crystal structure of alternating boron doped and undoped layers. At the end of the growth period the methane flow is terminated, the filament power and substrate power are terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving a heterostructure of alternating boron doped and undoped single crystal diamond layers.

A single crystal diamond structure is formed consisting of ten alternating layers of boron doped and undoped diamond of which are individually 0.02 µm thick, to total thickness being 0.2 µm thick, the structure being the upper layer of a 75 µm thick CVD single crystal diamond, all having a (100) orientation.

Example 10

Growth of (100) Oriented Boron Doped Single Crystal Diamond on a CVD Grown Single Crystal Synthetic Diamond Using the Microwave Plasma Method A polished CVD grown diamond single crystal having a (100) orientation and a thickness of 75 micrometers is cleaned with hot detergent in an ultrasonic cleaner, rinsed in acetone and dried. Following cleaning the substrate is placed in a microwave plasma reactor (MWCVD) having a molybdenum substrate holder. The reactor is evacuated to a pressure of less than 10 millitorr and then backfilled to a pressure of 40 torr with hydrogen having a purity of 99.999% and at a rate of 100 sccm.

Power is applied to the microwave generator to achieve a plasma ball and a substrate temperature of 900° C. as measured by a disappearing filament optical pyrometer. After stabilizing the plasma power and substrate temperature for five minutes methane gas and diborane is added to the gas stream so that the final mixture is 99% hydrogen and 1% methane containing 1000 ppm of diborane while maintaining the total gas flow at 100 sccm. Part of the hydrogen is converted to atomic hydrogen in the plasma and the methane decomposes in the presence of the atomic hydrogen on the substrate surface to form an epitaxial layer of diamond. Growth is maintained for 250 hours at a rate of 1 micrometer per hour to form a single crystal boron doped diamond of 250 micrometers thick. At the end of this time, the diborane flow is terminated, and the methane flow continued for an additional 75 hours. At the end of this time period the methane flow is terminated, the microwave power is terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving a boron doped single crystal diamond layer of 250 micrometer thick diamond crystal attached to an undoped single crystal diamond seed.

A boron doped single crystal diamond plate having a (100) orientation is obtained having a thickness of approximately 250 µm.

Example 11

Growth of (100) Oriented Single Crystal Diamond on a CVD Grown Single Crystal Synthetic Diamond Using the Arc Jet Method A polished CVD grown diamond single crystal having a (100) orientation and a thickness of 75 micrometers is cleaned with hot detergent in an ultrasonic cleaner, rinsed in acetone and dried. Following cleaning the substrate is placed in an arc jet microwave plasma reactor (MPCVD) having a molybdenum substrate holder. The reactor is evacuated to a pressure of less than 10 millitorr and then backfilled to a pressure of 100 torr with hydrogen having a purity of 99.999% and at a rate of 5000 sccm.

Power is applied to produce an arc in the hydrogen stream and a substrate temperature of 900° C. as measured by a disappearing filament optical pyrometer. After stabilizing the arc power and substrate temperature for five minutes methane gas is added to the chamber so that the final mixture is 99% hydrogen and 1% methane while maintaining the total gas flow at 5000 sccm. Part of the hydrogen is converted to atomic hydrogen in the gas stream and the methane decomposes in the presence of the atomic hydrogen on the substrate surface to form an epitaxial layer of diamond. Growth is maintained for 25 hours at a rate of 10 micrometers per hour to form a single crystal undoped diamond of 250 micrometers thick. At the end of this time period the methane flow is terminated, the arc power is terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving an undoped single crystal diamond layer of 250 micrometer thick diamond crystal attached to an undoped single crystal diamond seed.

An undoped single crystal diamond plate having a (100) orientation is obtained having a thickness of approximately 250 µm.

Example 12

Growth of Single Crystal Diamond on a CVD Grown Single Crystal Synthetic Diamond Using the Combustion Method A polished CVD grown diamond single crystal having a (100) orientation and a thickness of 75 micrometers is cleaned with hot detergent in an ultrasonic cleaner, rinsed in acetone and dried. Following cleaning the substrate is placed in an combustion flame reactor (CFCVD) having a water cooled molybdenum substrate holder and operating at atmospheric pressure. A gas mixture of acetylene and oxygen is utilized to heat the substrate to 1000° C. as measured by a disappearing filament optical pyrometer. After stabilizing the flame and substrate temperature for five minutes, the acetylene concentration is raised so that the composition is carbon rich and so that diamond growth begins. Part of the hydrogen is converted to atomic hydrogen in the flame and the acetylene and other hydrocarbons decompose in the presence of the atomic hydrogen on the substrate surface to form an epitaxial layer of diamond. Growth is maintained for 25 hours at a rate of 20 micrometer per hour to form a single crystal undoped diamond of 500 micrometers thick. At the end of this time period the acetylene and oxygen flow are terminated and the substrate with film is cooled to room temperature.

The single crystal diamond substrate with the attached diamond film is removed and cleaned in a mixture of chromic acid and sulfuric acid at temperature of 250° C. to remove residual non diamond carbon from the diamond surface, leaving an undoped single crystal diamond layer of 500 micrometer thick diamond crystal attached to an undoped single crystal diamond seed.

An undoped single crystal diamond plate having a (100) orientation is obtained having a thickness of approximately 500 µm.

Example 13

Growth of (110) Oriented Single Crystal Diamond on a CVD Grown Single Crystal Synthetic Diamond Using the Hot Filament Method A natural type IA diamond single crystal is sliced on a diamond impregnated saw to yield a substrate of (1110) orientation. The substrate is polished with diamond grit suspended in olive oil and impregnated into a cast iron plate to achieve a surface which is free of grooves, scratches or digs. The substrate is then cleaned with hot detergent in an ultrasonic cleaner, rinsed in acetone and dried. Following cleaning the substrate is placed in a hot filament chemical vapor deposition reactor (HFCVD) having a substrate heater consisting of a tungsten filament held within a molybdenum holder and having a rhenium filament approximately 10 mm from the substrate. The reactor is evacuated to a pressure of less than 10 millitorr and then backfilled to a pressure of 40 torr with hydrogen having a purity of 99.999% and at a rate of 100 sccm.

Power is applied to the rhenium filament to achieve a temperature of 2100° C. whereupon power is applied to the substrate heater until the substrate reaches a temperature of 950° C. as measured by a disappearing filament optical pyrometer. After stabilizing the temperature of the filament and substrate for five minutes methane gas is added to the temperature of the filament and substrate for five minutes methane gas is added to the gas stream so that the final mixture is 99% hydrogen and 1% methane while maintaining the total gas flow at 100 sccm. Part of the hydrogen is converted to atomic hydrogen on the surface of the filament and the methane decomposes in the presence of the atomic hydrogen on the substrate surface to form an epitaxial layer of diamond. Growth is maintained for 24 hours at a rate of 1 micrometer per hour to form a single crystal deposit of 24 micrometers thick. At the end of this time period the methane flow is terminated, the filament power and substrate power are terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving a single crystal diamond film attached to a single crystal seed.

An undoped single crystal diamond plate having a (110) orientation is obtained having a thickness of approximately 24 µm.

Example 14

Growth of (111) Oriented Single Crystal Diamond on a Natural Single Crystal Synthetic Diamond Using the Hot Filament Method A natural type IA diamond single crystal is cleaved along the (111) plane to yield a substrate of (100) orientation. The substrate is polished with diamond grit suspended in olive oil and impregnated into a cast iron plate to achieve a surface which is free of grooves, scratches or digs. This substrate is then cleaned with hot detergent in an ultrasonic cleaner, rinsed in acetone and dried. Following cleaning the substrate is placed in a hot filament chemical vapor deposition reactor (HFCVD) having a substrate heater consisting of a tungsten filament held within a molybdenum holder and having a rhenium filament approximately 10 mm from the substrate. The reactor is evacuated to a pressure of less than 10 millitorr and then backfilled to a pressure of 40 torr with hydrogen having a purity of 99.999% and at a rate of 100 sccm.

Power is applied to the rhenium filament to achieve a temperature of 2100° C. whereupon power is applied to the substrate heater until the substrate reaches a temperature of 950° C. as measured by a disappearing filament optical pyrometer. After stabilizing the temperature of the filament and substrate for five minutes methane gas is added to the temperature of the filament and substrate for five minutes methane gas is added to the gas stream so that the final mixture is 99% hydrogen and 1% methane while maintaining the total gas flow at 100 sccm. Part of the hydrogen is converted to atomic hydrogen on the surface of the filament and the methane decomposes in the presence of the atomic hydrogen on the substrate surface to form an epitaxial layer of diamond. Growth is maintained for 24 hours at a rate of 1 micrometer per hour to form a single crystal deposit of 24 micrometers thick. At the end of this time period the methane flow is terminated, the filament power and substrate power are terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving a single crystal diamond film attached to a single crystal seed.

Example 15

Growth of a (100) Oriented Boron and $^{13}$C Codoped Single Crystal Diamond Film on a CVD Grown Single Crystal Synthetic Diamond Using the Hot Filament Method A polished CVD grown diamond single crystal having a (100) orientation is cleaned with hot detergent in an ultrasonic cleaner, rinsed in acetone and dried. Following cleaning the substrate is placed in a hot filament chemical vapor deposition reactor (HCFVD) having a substrate heater consisting of a tungsten filament held within a molybdenum holder and having a rhenium filament approximately 10 mm from the substrate. The reactor is evacuated to a pressure of less than 10 millitorr and then backfilled to a pressure of 40 torr with hydrogen having a purity of 99.999% and at a rate of 100 sccm.

Power is applied to the rhenium filament to achieve a temperature of 2100° C. whereupon power is applied to the substrate heater until the substrate reaches a temperature of 960° C. as measured by a disappearing filament optical pyrometer. After stabilizing the temperature of the filament and substrate for five minutes methane gas which has been enriched with respect to $^{13}$C and boron metal is place alongside of the seed in direct coverage of atomic hydrogen from the hot filament. This results in hydrides of boron being added to the gas stream at some high level. boron is added to the gas stream so that the final mixture is 99% hydrogen and 1% $^{13}$C methane containing >100 ppm of boron containing gas while maintaining the total gas flow at 100 sccm. Part of the hydrogen is converted to atomic hydrogen on the surface of the filament and the methane decomposes in the presence of the atomic hydrogen on the substrate surface to form an epitaxial layer of diamond. Growth is maintained for 10 minutes at a rate of 1 micrometer per hour to form a single crystal deposit of 0.17 micrometers thick. At the end of this time period the methane flow is terminated, the filament power and substrate power are terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving a boron doped single crystal $^{13}$C diamond film attached to a normal isotope single crystal diamond seed.

A boron and $^{13}$C doped single crystal diamond film is grown (having reduced strain) attached to a CVD single crystal diamond substrate wherein the film has a (100) orientation and a thickness of approximately 0.17 μm.

Example 16

Growth of (100) Oriented Undoped Single Crystal Diamond on a High Pressure Grown Single Crystal Synthetic Diamond Using the Microwave Plasma Method A polished CVD grown diamond single crystal having a (100) orientation and a thickness of 75 micrometers is cleaned with hot detergent in an ultrasonic cleaner, rinsed in acetone and dried. Following cleaning the substrate is placed in a microwave plasma reactor (MWCVD) having a molybdenum substrate holder. The reactor is evacuated to a pressure of less than 10 millitorr and then backfilled to a pressure of 100 torr with hydrogen having a purity of 99.999% and at a rate of 100 sccm.

Power is applied to the microwave generator to achieve a plasma ball and a substrate temperature of 950° C. as measured by a disappearing filament optical pyrometer. After stabilizing the plasma power and substrate temperature for five minutes methane gas is added to the gas stream so that the final mixture is 95% hydrogen and 5% methane. Part of the hydrogen is converted to atomic hydrogen in the plasma and the methane decomposes in the presence of the atomic hydrogen on the substrate surface to form an epitaxial layer of diamond. Growth is maintained for 200 hours at a rate of 1 micrometer per hour to form a single crystal boron doped diamond of 1000 micrometers thick. At the end of this time period the methane flow is terminated, the microwave power is terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving an undoped single crystal diamond layer of 1000 micrometer thick diamond crystal attached to an undoped single crystal diamond seed.

Example 17

Growth of (100) Oriented Undoped Single Crystal Diamond on a High Pressure Grown Single Crystal Synthetic Diamond Using the Microwave Plasma Method A polished High Pressure grown diamond single crystal having a (100) orientation and a thickness of 75 micrometers is cleaned with hot detergent in an ultrasonic cleaner, rinsed in acetone and dried. Following cleaning the substrate is placed in a microwave plasma reactor (MWCVD) having a molybdenum substrate holder. The reactor is evacuated to a pressure of less than 10 millitorr and then backfilled to a pressure of 100 torr with hydrogen having a purity of 99.999% and at a rate of 100 sccm.

Power is applied to the microwave generator to achieve a plasma ball and a substrate temperature of 950° C. as measured by a disappearing filament optical pyrometer. After stabilizing the plasma power and substrate temperature for five minutes methane gas is added to the gas stream so that the final mixture is 88% hydrogen and 12% methane. Part of the hydrogen is converted to atomic hydrogen in the plasma and the methane decomposes in the presence of the atomic hydrogen on the substrate surface to form an epitaxial layer of diamond. Growth is maintained for 20 hours at a rate of 30 micrometer per hour to form a single crystal diamond of 600 micrometers thick. At the end of this time period the methane flow is terminated, the microwave power is terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving an undoped single crystal diamond layer of 600 micrometer thick diamond crystal attached to an undoped single crystal diamond seed.

Example 18

Growth of (100) Oriented Undoped Single Crystal Diamond on a High Pressure Grown Single Crystal Synthetic Diamond Using the DC Plasma Method A polished CVD grown diamond single crystal having a (100) orientation and a thickness of 75 micrometers is cleaned with hot detergent in an ultrasonic cleaner, rinsed in acetone and dried. Following cleaning the substrate is placed in a DC plasma reactor (MWCVD) having a molybdenum substrate holder. The reactor is evacuated to a pressure of less than 10 millitorr and then backfilled to a pressure of 100 torr with hydrogen having a purity of 99.999% and at a rate of 100 sccm.

Power is applied to the microwave generator to achieve a plasma ball and a substrate temperature of 950° C. as measured by a disappearing filament optical pyrometer. After stabilizing the plasma power and substrate temperature for five minutes methane gas is added to the gas stream so that the final mixture is 95% hydrogen and 1% methane. Part of the hydrogen is converted to atomic hydrogen in the plasma and the methane decomposes in the presence of the atomic hydrogen on the substrate surface to form an epitaxial layer of diamond. Growth is maintained for 200 hours at a rate of 5 micrometer per hour to form a single crystal diamond of 1000 micrometers thick. At the end of this time period the methane flow is terminated, the microwave power is terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving an undoped single crystal diamond layer of 1000 micrometer thick diamond crystal attached to an undoped single crystal diamond seed.

Example 19

Growth of (100) Oriented Undoped Single Crystal Diamond on a High Pressure Grown Single Crystal Synthetic Diamond Using the DC Plasma Method A polished CVD grown diamond single crystal having a (100) orientation and a thickness of 75 micrometers is cleaned with hot detergent in an ultrasonic cleaner, rinsed in acetone and dried. Following cleaning the substrate is placed in a microwave plasma reactor (MWCVD) having a molybdenum substrate holder. The reactor is evacuated to a pressure of less than 10 millitorr and then backfilled to a pressure of 150 torr with hydrogen having a purity of 99.999% and at a rate of 100 sccm.

Power is applied to the microwave generator to achieve a plasma ball and a substrate temperature of 950° C. as measured by a disappearing filament optical pyrometer. After stabilizing the plasma power and substrate temperature for five minutes methane gas is added to the gas stream so that the final mixture is 95% hydrogen and 5% methane. Part of the hydrogen is converted to atomic hydrogen in the plasma and the methane decomposes in the presence of the atomic hydrogen on the substrate surface to form an epitaxial layer of diamond. Growth is maintained for 200 hours at a rate of 5 micrometer per hour to form a single crystal diamond of 1000 micrometers thick. At the end of this time period the methane flow is terminated, the microwave power is terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving an undoped single crystal diamond layer of 1000 micrometer thick diamond crystal attached to an undoped single crystal diamond seed.

Example 20

Growth of (100) Oriented Undoped Single Crystal Diamond on a High Pressure Grown Single Crystal Synthetic Diamond Using the RF Plasma Method A polished CVD grown diamond single crystal having a (100) orientation and a thickness of 75 micrometers is cleaned with hot detergent in an ultrasonic cleaner, rinsed in acetone and dried. Following cleaning the substrate is placed in a RF plasma reactor (MWCVD) having a molybdenum substrate holder. The reactor is evacuated to a pressure of less than 10 millitorr and then backfilled to a pressure of 100 torr with hydrogen having a purity of 99.999% and at a rate of 100 sccm.

Power is applied to the microwave generator to achieve a plasma ball and a substrate temperature of 950° C. as measured by a disappearing filament optical pyrometer. After stabilizing the plasma power and substrate temperature for five minutes methane gas is added to the gas stream so that the final mixture is 95% hydrogen and 5%. Part of the hydrogen is converted to atomic hydrogen in the plasma and the methane decomposes in the presence of the atomic hydrogen on the substrate surface to form an epitaxial layer of diamond. Growth is maintained for 200 hours at a rate of 5 micrometer per hour to form a single crystal boron doped diamond of 1000 micrometers thick. At the end of this time period the methane flow is terminated, the microwave power is terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving an undoped single crystal diamond layer of 1000 micrometer thick diamond crystal attached to an undoped single crystal diamond seed.

Example 21

Growth of a (100) Oriented Phosphorous and $^{13}C$ Codoped Single Crystal Diamond Film on a CVD Grown Single Crystal Synthetic Diamond Using the Microwave Plasma Method A polished CVD grown diamond single crystal having a (100) orientation is cleaned with hot detergent in an ultrasonic cleaner, rinsed in acetone and dried. Following cleaning the substrate is placed in a microwave plasma vapor deposition reactor (MWPCVD) having a substrate heater consisting of a tungsten filament held within a molybdenum holder. The reactor is evacuated to a pressure of less than 10 millitorr and then backfilled to a pressure of 40 torr with hydrogen having a purity of 99.999% and at a rate of 100 seem.

Power is applied to the plasma and power is applied to the substrate heater until the substrate reaches a temperature of 960° C. as measured by a disappearing filament optical pyrometer. After stabilizing the temperature of the substrate for five minutes methane gas which has been enriched with respect to $^{13}C$ and phosphene is introduced into the chamber. This results in phosphorous being added to the gas stream at 100 ppm while the final gas mixture is maintained at 99% hydrogen and 1% $^{13}C$ methane maintaining the total gas flow at 100 seem. Part of the hydrogen is converted to atomic hydrogen in the plasma and the methane decomposes in the presence of the atomic hydrogen on the substrate surface to form an epitaxial layer of diamond. Growth is maintained for 10 minutes at a rate of 1 micrometer per hour to form a single crystal deposit of 0.17 micrometers thick. At the end of this time period the methane flow is terminated, the filament power and substrate power are terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving a phosphorous doped single crystal $^{13}C$ diamond film attached to a normal isotope single crystal diamond seed.

A phosphorous and $^{13}C$ doped single crystal diamond film is grown (having reduced strain) attached to a CVD single crystal diamond substrate wherein the film has a (100) orientation and a thickness of approximately 0.17 $\mu$m.

Example 22

Growth of a (100) Oriented Sulfur and $^{13}C$ Codoped Single Crystal Diamond Film on a CVD Grown Single Crystal Synthetic Diamond Using the Microwave Plasma Method A polished CVD grown diamond single crystal having a (100) orientation is cleaned with hot detergent in an ultrasonic cleaner, rinsed in acetone and dried. Following cleaning the substrate is placed in a microwave plasma vapor deposition reactor (MWPCVD) having a substrate heater consisting of a tungsten filament held within a molybdenum holder. The reactor is evacuated to a pressure of less than 10 millitorr and then backfilled to a pressure of 40 torr with hydrogen having a purity of 99.999% and at a rate of 100 sccm.

Power is applied to the plasma and power is applied to the substrate heater until the substrate reaches a temperature of 960° C. as measured by a disappearing filament optical pyrometer. After stabilizing the temperature of the substrate for five minutes methane gas which has been enriched with respect to $^{13}C$ and hydrogen sulfide is introduced into the chamber. This results in hydrogen sulfide being added to the gas stream at 100 ppm while the final gas mixture is maintained at 99% hydrogen and 1% $^{13}C$ methane maintaining the total gas flow at 100 sccm. Part of the hydrogen is converted to atomic hydrogen in the plasma and the methane decomposes in the presence of the atomic hydrogen on the substrate surface to form an epitaxial layer of diamond. Growth is maintained for 10 minutes at a rate of 1 micrometer per hour to form a single crystal deposit of 0.17 micrometers thick. At the end of this time period the methane flow is terminated, the filament power and substrate power are terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving a sulfur doped single crystal $^{13}C$ diamond film attached to a normal isotope single crystal diamond seed.

A sulfur and $^{13}C$ doped single crystal diamond film is grown (having reduced strain) attached to a CVD single crystal diamond substrate wherein the film has a (100) orientation and a thickness of approximately 0.17 $\mu$m.

Example 23

Growth of a (100) Oriented Nitrogen And $^{13}C$ Codoped Single Crystal Diamond Film on a CVD Grown Single Crystal Synthetic Diamond Using the Microwave Plasma Method A polished CVD grown diamond single crystal having a (100) orientation is cleaned with hot detergent in an ultrasonic cleaner, rinsed in acetone and dried. Following cleaning the substrate is placed in a microwave plasma vapor deposition reactor (MWPCVD) having a substrate heater consisting of a tungsten filament held within a molybdenum holder. The reactor is evacuated to a pressure of less than 10 millitorr and then backfilled to a pressure of 40 torr with hydrogen having a purity of 99.999% and at a rate of 100 sccm.

Power is applied to the plasma and power is applied to the substrate heater until the substrate reaches a temperature of 960° C. as measured by a disappearing filament optical pyrometer. After stabilizing the temperature of the substrate for five minutes methane gas which has been enriched with respect to $^{13}C$ and nitrogen is introduced into the chamber. This results in nitrogen being added to the gas stream at 100 ppm while the final gas mixture is maintained at 99% hydrogen and 1% $^{13}C$ methane maintaining the total gas flow at 100 sccm. Part of the hydrogen is converted to atomic hydrogen in the plasma and the methane decomposes in the presence of the atomic hydrogen on the substrate surface to form an epitaxial layer of diamond. Growth is maintained for 10 minutes at a rate of 1 micrometer per hour to form a single crystal deposit of 0.17 micrometers thick. At the end of this time period the methane flow is terminated, the filament power and substrate power are terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving a nitrogen doped single crystal $^{13}$C diamond film attached to a normal isotope single crystal diamond seed.

A nitrogen and $^{13}$C doped single crystal diamond film is grown (having increased tensile strain) attached to a CVD single crystal diamond substrate wherein the film has a (100) orientation and a thickness of approximately 0.17 μm.

Example 24

Growth of (100) Oriented Boron Doped Single Crystal Diamond on a CVD Grown Single Crystal Synthetic Diamond Using the Microwave Plasma Method A polished CVD grown diamond single crystal having a (100) orientation and a thickness of 1000 micrometers is cleaned with hot detergent in an ultrasonic cleaner, rinsed in acetone and dried. Following cleaning the substrate is placed in a microwave plasma reactor (MWCVD) having a molybdenum substrate holder. The reactor is evacuated to a pressure of less than 10 millitorr and then backfilled to a pressure of 40 torr with hydrogen having a purity of 99.999% and at a rate of 100 sccm.

Power is applied to the microwave generator to achieve a plasma ball and a substrate temperature of 900° C. as measured by a disappearing filament optical pyrometer. After stabilizing the plasma power and substrate temperature for five minutes methane gas and diborane is added to the gas stream so that the final mixture is 99% hydrogen and 1% methane containing 1000 ppm of diborane while maintaining the total gas flow at 100 sccm. Part of the hydrogen is converted to atomic hydrogen in the plasma and the methane decomposes in the presence of the atomic hydrogen on the substrate surface to form an epitaxial layer of diamond. Growth is maintained for 0.5 hours at a rate of 1 micrometer per hour to form a single crystal boron doped diamond of 0.5 micrometers thick. At the end of this time, the diborane flow and the methane flow is terminated, the microwave power is terminated and the substrate with film is cooled to room temperature. At this point the reactor is evacuated to remove all hydrogen and then filled with room air to atmospheric pressure.

The single crystal diamond substrate with the attached boron doped diamond film is removed and cleaned in a mixture of chromic acid and sulfuric acid at temperature of 250° C. to remove residual non diamond carbon from the diamond surface, leaving a boron doped single crystal diamond layer of 0.5 micrometer thick diamond crystal attached to an undoped single crystal diamond seed.

A boron doped single crystal diamond film, having a thickness less than the critical thickness is obtained on an undoped single crystal diamond plate having a (100) orientation.

Example 25

Growth of (100) Oriented Boron Doped Single Crystal Diamond on a CVD Grown Single Crystal Synthetic Diamond Using the Microwave Plasma Method.

A polished CVD grown diamond single crystal having a (100) orientation and a thickness of 1000 micrometers is cleaned with hot detergent in an ultrasonic cleaner, rinsed in acetone and dried. Following cleaning the substrate is placed in a microwave plasma reactor (MWCVD) having a molybdenum substrate holder. The reactor is evacuated to a pressure of less than 10 millitorr and then backfilled to a pressure of 40 torr with hydrogen having a purity of 99.999% and at a rate of 100 sccm.

Power is applied to the microwave generator to achieve a plasma ball and a substrate temperature of 900° C. as measured by a disappearing filament optical pyrometer. After stabilizing the plasma power and substrate temperature for five minutes methane gas and diborane is added to the gas stream so that the final mixture is 99% hydrogen and 1% methane containing 1000 ppm of diborane while maintaining the total gas flow at 100 sccm. Part of the hydrogen is converted to atomic hydrogen in the plasma and the methane decomposes in the presence of the atomic hydrogen on the substrate surface to form an epitaxial layer of diamond. Growth is maintained for 25 hours at a rate of 1 micrometer per hour to form a single crystal boron doped diamond of 25 micrometers thick. At the end of this time, the diborane flow the methane flow is terminated, the microwave power is terminated and the substrate with film is cooled to room temperature. At this point the reactor is evacuated to remove all hydrogen and then filled with room air to atmospheric pressure.

The single crystal diamond substrate with the attached diamond film is removed and cleaned in a mixture of chromic acid and sulfuric acid at temperature of 250° C. to remove residual non diamond carbon from the diamond surface, leaving a boron doped single crystal diamond layer of 25 micrometer thick diamond crystal attached to an undoped single crystal diamond seed.

A boron doped single crystal diamond film having a thickness greater than the critical thickness plate having a (100) orientation is obtained on an undoped single crystal diamond substrate.

What is claimed is:

1. A method of forming a synthetic monocrystalline diamond comprising the steps of:

a) forming on a substrate by a chemical vapor deposition process a first synthetic diamond layer incorporating one or more impurities and one or more carbon isotopes; and b) selecting concentrations of the one or more carbon isotopes and the one or more impurities during the formation of the first synthetic diamond layer, in order to form the first synthetic diamond layer with a predetermined lattice constant having a corresponding level of lattice strain, wherein the level of lattice strain corresponds to how much the lattice constant of the first synthetic diamond layer varies from a lattice constant of natural diamond, wherein a ratio comprised of a difference between the lattice constant of the first synthetic diamond layer and the lattice constant of pure diamond over the lattice constant of pure diamond is used in determining a critical thickness that the first synthetic diamond layer can be formed to without damaging the layer, wherein the critical thickness of the first synthetic diamond layer is the level which if exceeded results in dislocations in the diamond structure followed by fracturing of the diamond structure, wherein the formation of the dislocations in the first synthetic diamond layer can be lessened or eliminated by further forming by a chemical vapor deposition process a series of synthetic diamond layers that alternate in tension and compression thereon.

2. The method of claim 1, wherein the step of forming the first synthetic diamond layer comprises expanding atomic spacing of the first synthetic diamond layer by incorporating the one or more impurities and contracting atomic spacing of the first synthetic diamond layer by incorporating the one or more carbon isotopes.

3. The method of claim 2, wherein the expanding effect of incorporating the one or more impurities introduces lattice strain to the formed first synthetic diamond layer.

4. The method of claim 2, wherein the step of selecting the concentrations of the one or more carbon isotopes and the one or more impurities comprises counteracting the expanding effect of incorporating the one or more impurities with the contracting effect of incorporating the one or more carbon isotopes in forming the first synthetic diamond layer such at the lattice strain introduced to the first synthetic diamond layer during its formation is either tailored to a specific level or substantially eliminated.

5. The method of claim 1, wherein the critical thickness of the first synthetic diamond layer decreases as the concentration of the one or more impurities increases in the diamond layer.

6. The method of claim 1, wherein the series of alternating synthetic diamond layers would redirect the dislocations into the plane of the alternating synthetic diamond layers such that one or more second synthetic diamond layers could be grown by a chemical vapor deposition process onto the first synthetic diamond layer and have substantially no strain.

7. The method of claim 1, further comprising the step of initially determining the lattice constant of the first synthetic diamond layer to be formed.

8. The method of claim 1, further comprising the step of initially determining a critical thickness of the first synthetic diamond layer to be formed.

9. The method of claim 1, wherein the monocrystalline synthetic diamond is formed having a controlled level of lattice match or mismatch between the substrate the first synthetic diamond.

10. The method of claim 9, wherein the controlled level of lattice match comprises each of the first synthetic diamond layer and the substrate having substantially aligned lattice constants.

11. The method of claim 10, wherein each of the first synthetic diamond layer and the substrate have substantially no lattice strain.

12. The method of claim 9, wherein the controlled level of lattice mismatch comprises the first synthetic diamond layer having a lattice constant that is not aligned with a lattice constant of the substrate.

13. The method of claim 12, wherein the first synthetic diamond layer has a level of lattice strain and the substrate has substantially no lattice strain.

14. The method of claim 12, wherein the first synthetic diamond layer has substantially no lattice strain and the substrate has a level of lattice strain.

15. The method of claim 12, wherein the first synthetic diamond layer and the substrate each have a level of lattice strain, but the formation of the first synthetic diamond layer to the substrate results in effectively but not literally aligning the lattice constants of the diamond layer and the substrate.

16. The method of claim 15, wherein the first synthetic diamond layer is under tension and the substrate is under compression.

17. The method of claim 15, wherein the first synthetic diamond layer is under compression and the substrate is under tension.

18. The method of claim 15, wherein the effective but not literal alignment of the lattice constants is attained by counteracting tensile and compressive forces on the first synthetic diamond layer and the substrate.

19. The method of claim 1, wherein the incorporation of one or more impurities comprises adding the one or more impurities during the diamond formation process.

20. The method of claim 1, wherein the incorporation of one or more impurities comprises adding the one or more impurities after the diamond formation process.

21. The method of claim 1, wherein the substrate comprises a layer of pure diamond having about 99% $^{12}$C isotope and about 1% $^{13}$C isotope.

22. The method of claim 1, wherein the substrate comprises a layer of diamond formed by a high pressure, high temperature process.

23. The method of claim 1, wherein the substrate comprises a layer of diamond formed by a chemical vapor deposition process.

24. The method of claim 23, wherein the layer of diamond is substantially similar to pure diamond having about 99% $^{12}$C isotope and about 1% $^{13}$C isotope and substantially no lattice strain.

25. The method of claim 23, wherein the substrate comprises one or more carbon isotopes.

26. The method of claim 23, wherein the substrate comprises one of more carbon isotopes and one or more impurities.

27. The method of claim 1, wherein the one or more carbon isotopes comprises $^{13}$C isotope.

28. The method of claim 1, wherein the one or more carbon isotopes comprises a combination of both $^{13}$C isotope and $^{12}$C isotope.

29. The method of claim 28, wherein the atomic spacing is smaller in the $^{13}$C isotope than in the $^{12}$C isotope.

30. The method of claim 1, wherein the one or more impurities has atomic size that is larger than an atomic size of the one or more carbon isotopes.

31. The method of claim 1, wherein the first synthetic diamond layer provides enhanced electrical, mechanical, or optical properties through the use of the one or more impurities as compared to a diamond layer similarly prepared without the use of the one or more impurities.

32. The method of claim 1, wherein the one or more impurities is selected from a group consisting of boron, nitrogen, lithium, phosphorous, and sulfur.

33. A monocrystalline synthetic diamond formed according to the method of claim 1.

34. A method of fabricating an electrical device, comprising the steps of:
   a) designing the electrical device having specific electrical parameters that are warranted for a predetermined operation;
   b) forming the monocrystalline synthetic diamond of claim 33 based upon the specific electrical parameters; and
   c) creating the electrical device with the monocrystalline synthetic diamond.

35. The method of claim 34, wherein the step of designing the electrical device having specific electrical parameters comprises selecting electrical parameters from the group consisting of resistivity, breakdown voltage, carrier lifetime, electron mobility, hole mobility, charge collection distance, bandgap, and oxidation resistivity.

36. An electrical device fabricated according to the method of claim 34.

37. The electrical device of claim 36, wherein the electrical device is selected from the group consisting of semiconductor devices, field effect transistors, light emitting diodes, high voltage switches, p-n junctions, Schottky diodes, surgical device contact surfaces, sensors, detectors, electrodes, filters, and quantum computing devices.

38. A method of fabricating an optical device, comprising the step of:
    a) designing the optical device having specific optical parameters that are warranted for a predetermined operation;
    b) forming the monocrystalline synthetic diamond of claim 33 based upon the specific optical parameters; and
    c) creating the optical device with the monocrystalline synthetic diamond.

39. The method of claim 38, wherein the step of designing the optical device having specific optical parameters comprises selecting optical parameters from the group consisting of index of refraction, transmission efficiency, and bandgap.

40. An optical device fabricated according to the method of claim 38.

41. The optical device of claim 40, wherein the optical device is selected from the group consisting of waveguides, windows, gemstones, anvils, light emitting diodes, and filters.

42. A method of fabricating an industrial device, comprising the steps of:
    a) designing the industrial device having specific mechanical parameters that are warranted for a predetermined operation;
    b) forming the monocrystalline synthetic diamond of claim 33 based upon the specific mechanical parameters; and
    c) creating the mechanical device with the monocrystalline synthetic diamond.

43. The method of claim 42, wherein the step of designing the industrial device having specific mechanical parameters comprises selecting mechanical parameters from the group consisting of hardness, thermal expansion, inertness, wear resistance, friction, thermal conductivity, and oxidation resistivity.

44. An industrial device fabricated according to the method of claim 42.

45. The industrial device of claim 44, wherein the industrial device is selected from the group consisting of cutting tools, wear plates, bearings, wire dies, abrasives, heat spreaders, wire dies, microtomes, and spacers.

* * * * *